(12) United States Patent
Amari

(10) Patent No.: US 9,177,970 B2
(45) Date of Patent: Nov. 3, 2015

(54) SEMICONDUCTOR DEVICE, METHOD OF MANUFACTURING THE SAME, METHOD OF MANUFACTURING DISPLAY UNIT, AND METHOD OF MANUFACTURING ELECTRONIC APPARATUS

(71) Applicant: Joled Inc., Tokyo (JP)

(72) Inventor: Koichi Amari, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/186,170

(22) Filed: Feb. 21, 2014

(65) Prior Publication Data

US 2014/0246711 A1    Sep. 4, 2014

(30) Foreign Application Priority Data

Mar. 4, 2013   (JP) ................. 2013-041728

(51) Int. Cl.
*H01L 27/14*   (2006.01)
*H01L 27/12*   (2006.01)

(52) U.S. Cl.
CPC .......... *H01L 27/124* (2013.01); *H01L 27/1248* (2013.01); *H01L 27/1259* (2013.01); *H01L 27/1288* (2013.01)

(58) Field of Classification Search
CPC ............ H01L 27/1251; H01L 27/3251; H01L 27/3262; H01L 27/1248; H01L 27/1288; H01L 27/1259; H01L 27/124; H01L 27/3276

USPC ............ 257/13, 21, 59, 72, 79, E51.005, 288, 257/368, 369; 438/116, 149
See application file for complete search history.

(56) References Cited

U.S. PATENT DOCUMENTS

2005/0001963 A1* 1/2005 Yokoyama .................... 349/122
2012/0188498 A1* 7/2012 Nishino et al. ................ 349/143

FOREIGN PATENT DOCUMENTS

| JP | 2010-182818 | 8/2010 |
| JP | 2010-182819 | 8/2010 |
| JP | 2012-160679 | 8/2012 |

* cited by examiner

*Primary Examiner* — Jarrett Stark
*Assistant Examiner* — Shahed Ahmed
(74) *Attorney, Agent, or Firm* — K&L Gates LLP

(57) ABSTRACT

A semiconductor device includes: a gate electrode and a wiring; a first insulating film covering the gate electrode and the wiring; a semiconductor film opposed to the gate electrode with the first insulating film in between; a first concave section located in a position adjacent to the semiconductor film; a connection hole, the connection hole being provided in the first insulating film, and the connection hole reaching the wiring, and a first electrically-conductive film, the first electrically-conductive film being electrically connected to the wiring through the connection hole, and the first electrically-conductive film being buried in the first concave section.

5 Claims, 28 Drawing Sheets

SEMICONDUCTOR DEVICE, METHOD OF MANUFACTURING THE SAME, METHOD OF MANUFACTURING DISPLAY UNIT, AND METHOD OF MANUFACTURING ELECTRONIC APPARATUS

CROSS REFERENCES TO RELATED APPLICATIONS

The present application claims priority to Japanese Priority Patent Application JP 2013-041728 filed in the Japan Patent Office on Mar. 4, 2013, the entire content of which is hereby incorporated by reference.

BACKGROUND

The present application relates to a semiconductor device electrically connected to a wiring such as a signal line, to a method of manufacturing the semiconductor device, and to a method of manufacturing a display unit and a method of manufacturing an electronic apparatus that use the method of manufacturing the semiconductor device.

In recent years, as a display has been grown in size and high-definition thereof has been achieved, high mobility has been demanded for a TFT (Thin Film Transistor) as a drive element, and a semiconductor device having a TFT formed of an oxide semiconductor such as an oxide of one of zinc (Zn), indium (In), gallium (Ga), tin (Sn), aluminum (Al), and titanium (Ti) and an oxide of a mixture thereof has been positively developed (for example, Japanese Unexamined Patent Application Publication Nos. 2010-182818, 2010-182819, and 2012-160679). In particular, it has been known that, in a TFT formed of a composite oxide of Zn, In, and Ga, electron mobility is large and superior electric characteristics are shown compared to a TFT formed of amorphous silicon (a-Si: H) generally used for a liquid crystal display or the like.

Further, a TFT made of an organic semiconductor material attracts attention. The organic TFT is allowed to be manufactured at low cost, and has high flexibility.

SUMMARY

However, the foregoing oxide semiconductor, the foregoing organic semiconductor, and the like are easily affected by moisture, and TFT characteristics are changed due to moisture intrusion into a channel. In the case where a semiconductor material such as polysilicon and amorphous silicon is used, moisture intrusion may affect TFT characteristics. To address such a disadvantage, a method in which a side surface of a semiconductor film is covered with a source-drain electrode, that is, a method to improve reliability by preventing moisture intrusion into a semiconductor film by a metal film has been proposed (for example, Japanese Unexamined Patent Application Publication Nos. 2010-182818 and 2010-182819).

It has been desired that such a highly-reliable TFT be manufactured by a simpler method.

It is desirable to provide a semiconductor device that is capable of suppressing moisture intrusion into a semiconductor film and that is manufactured by a simpler method, a method of manufacturing the same, a method of manufacturing a display unit, and a method of manufacturing an electronic apparatus.

According to an embodiment of the present application, there is provided a method of manufacturing a semiconductor device, the method including: forming a gate electrode and a wiring; covering the gate electrode and the wiring with a first insulating film; forming a semiconductor film on the gate electrode with the first insulating film in between; covering the semiconductor film and the first insulating film with a second insulating film; patterning the second insulating film and the first insulating film by one step to form a connection hole and a first concave section, the connection hole reaching the wiring, and the first concave section being located in a position adjacent to the semiconductor film; and forming a first electrically-conductive film in a region from the connection hole to the first concave section to electrically connect the first electrically-conductive film to the wiring through the connection hole and to bury the first electrically-conductive film into the first concave section.

According to an embodiment of the present application, there is provided a method of manufacturing a display unit, the method including forming a display element and a semiconductor device configured to drive the display element, the forming the display element and the semiconductor device including forming a gate electrode and a wiring, covering the gate electrode and the wiring with a first insulating film, forming a semiconductor film on the gate electrode with the first insulating film in between, covering the semiconductor film and the first insulating film with a second insulating film, patterning the second insulating film and the first insulating film by one step to form a connection hole and a first concave section, the connection hole reaching the wiring, and the first concave section being located in a position adjacent to the semiconductor film, and forming a first electrically-conductive film in a region from the connection hole to the first concave section to electrically connect the first electrically-conductive film to the wiring through the connection hole and to bury the first electrically-conductive film into the first concave section.

According to an embodiment of the present application, there is provided a method of manufacturing an electronic apparatus, the method including forming a display unit having a display element and a semiconductor device configured to drive the display element, the forming the display unit including forming a gate electrode and a wiring, covering the gate electrode and the wiring with a first insulating film, forming a semiconductor film on the gate electrode with the first insulating film in between, covering the semiconductor film and the first insulating film with a second insulating film, patterning the second insulating film and the first insulating film by one step to form a connection hole and a first concave section, the connection hole reaching the wiring, and the first concave section being located in a position adjacent to the semiconductor film, and forming a first electrically-conductive film in a region from the connection hole to the first concave section to electrically connect the first electrically-conductive film to the wiring through the connection hole and to bury the first electrically-conductive film into the first concave section.

According to an embodiment of the present application, there is provided a semiconductor device including: a gate electrode and a wiring; a first insulating film covering the gate electrode and the wiring; a semiconductor film opposed to the gate electrode with the first insulating film in between; a first concave section located in a position adjacent to the semiconductor film; a connection hole, the connection hole being provided in the first insulating film, and the connection hole reaching the wiring, and a first electrically-conductive film, the first electrically-conductive film being electrically connected to the wiring through the connection hole, and the first electrically-conductive film being buried in the first concave section.

In the semiconductor device according to the above-described embodiment of the present application, the first electrically-conductive film is buried in the first concave section in a position adjacent to the semiconductor film, and an end position of the semiconductor film is covered with the first electrically-conductive film. Thereby, moisture intrusion into the semiconductor film is suppressed. The first concave section is patterned together with the connection hole by one exposure step with the use, for example, of a multi-gradation mask.

According to the semiconductor device, the method of manufacturing the same, the method of manufacturing the display unit, and the method of manufacturing the electronic apparatus according to the above-described embodiments of the present application, the first concave section and the connection hole are patterned by one step. Therefore, a highly-reliable thin film transistor is allowed to be obtained by a simpler method.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

Part (A) and Part (B) of FIG. 1 are views illustrating a configuration of a main portion of a display unit according to a first embodiment of the present application.

Figure 9:
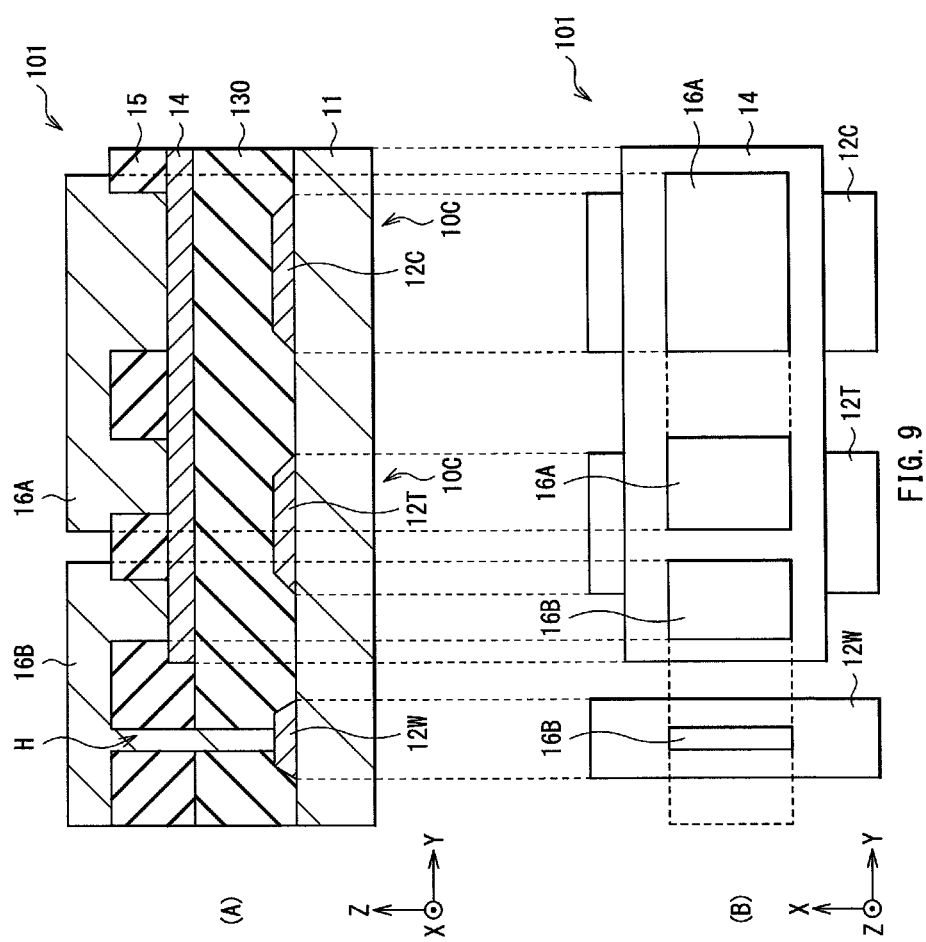

Part (A) and Part (B) of FIG. 9 are views illustrating a configuration of a main portion of a display unit according to Comparative example 1.

Figure 10A:
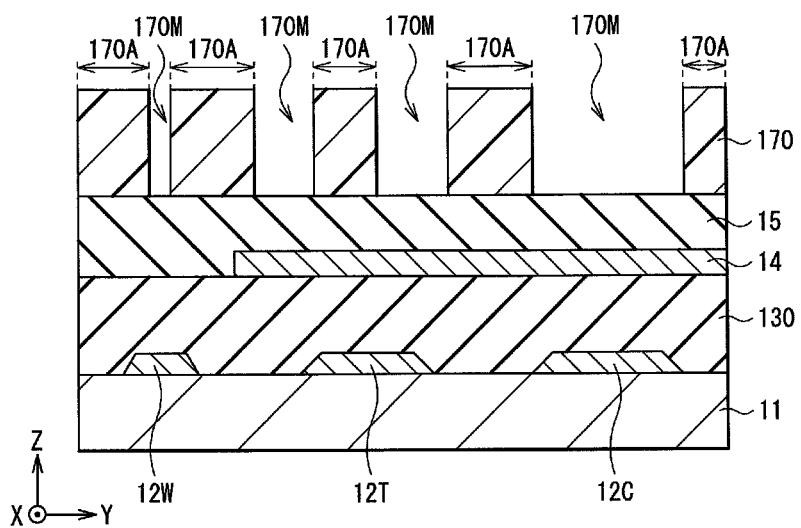

FIG. 10A is a cross-sectional view illustrating a step of manufacturing the display unit illustrated in Part (A) and Part (B) of FIG. 9.

Figure 10B:
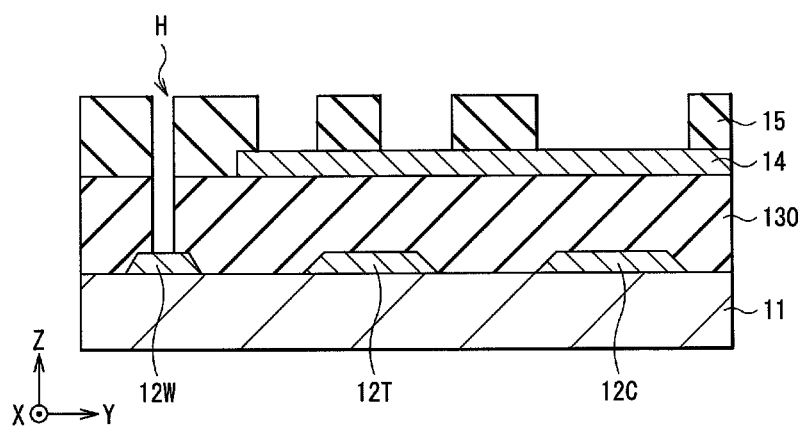

FIG. 10B is a cross-sectional view illustrating a step following the step of FIG. 10A.

Figure 11:
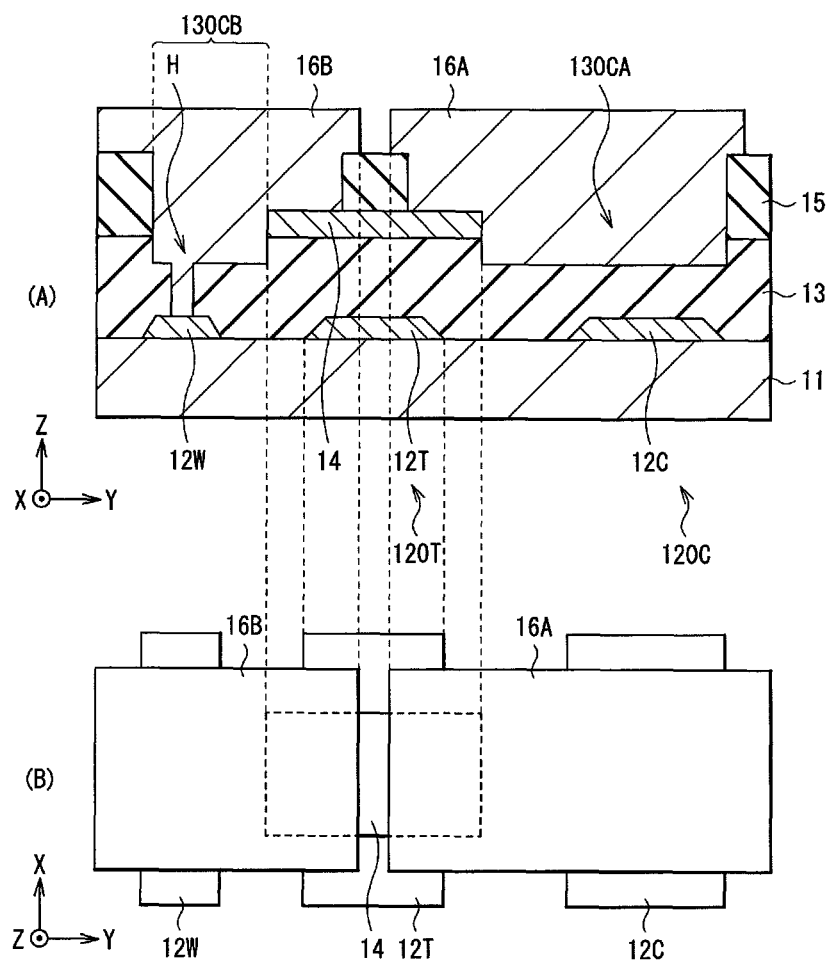

Part (A) and Part (B) of FIG. 11 are views illustrating a configuration of a main portion of a display unit according to Comparative example 2.

Figure 12A:
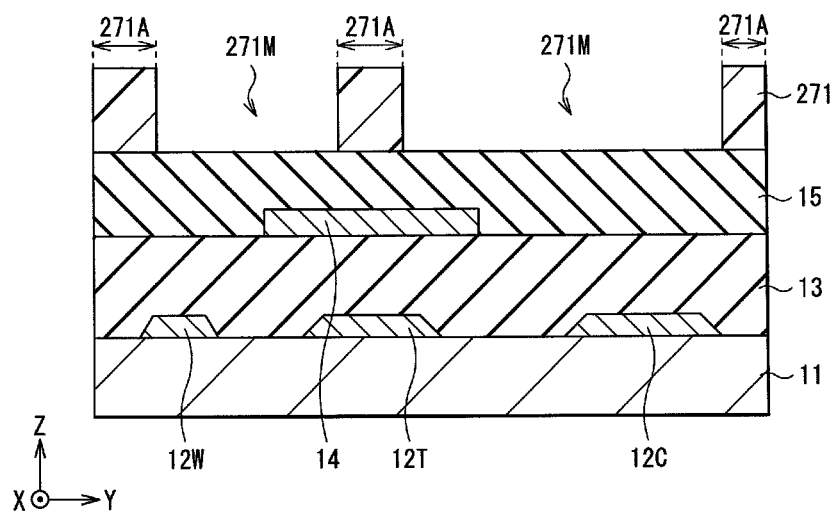

FIG. 12A is a cross-sectional view illustrating a step of manufacturing the display unit illustrated in Part (A) and Part (B) of FIG. 11.

Figure 12B:
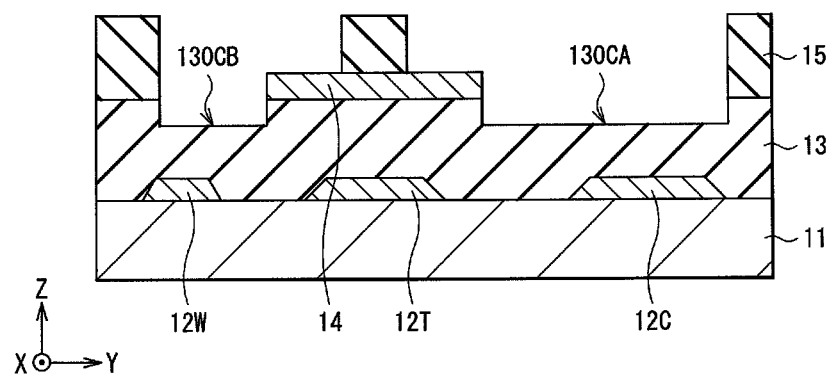

FIG. 12B is a cross-sectional view illustrating a step following the step of FIG. 12A.

Figure 12C:
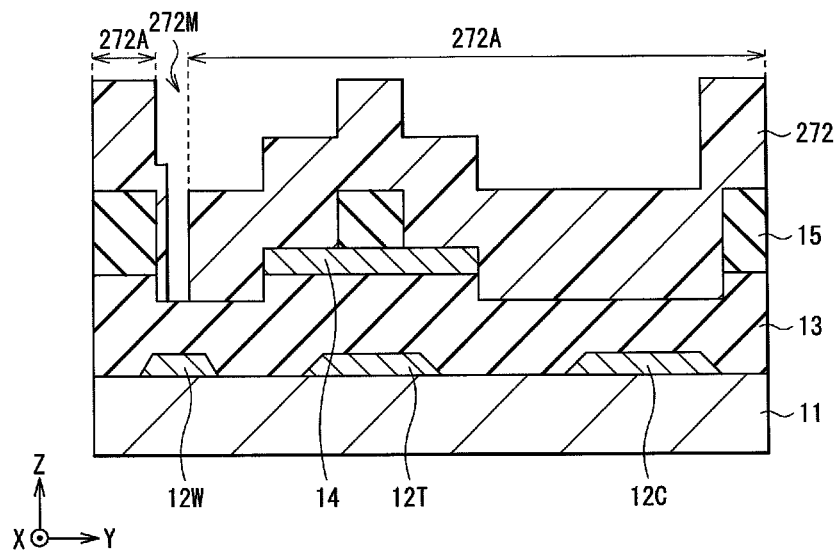

FIG. 12C is a cross-sectional view illustrating a step following the step of FIG. 12B.

Figure 12D:
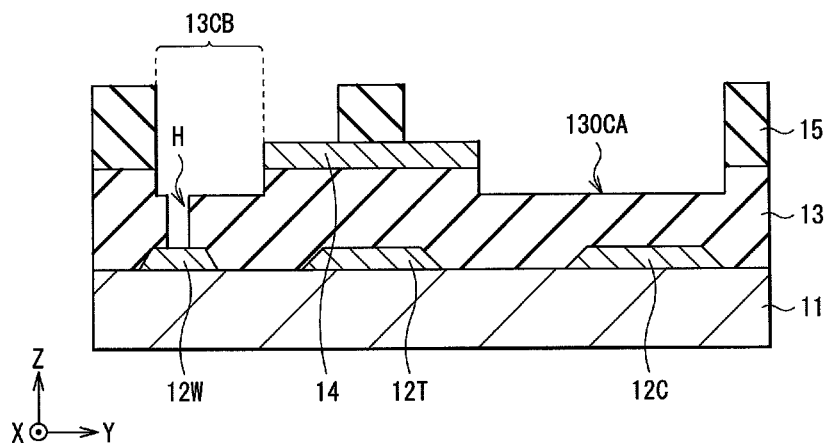

FIG. 12D is a cross-sectional view illustrating a step following the step of FIG. 12C.

Figure 13:
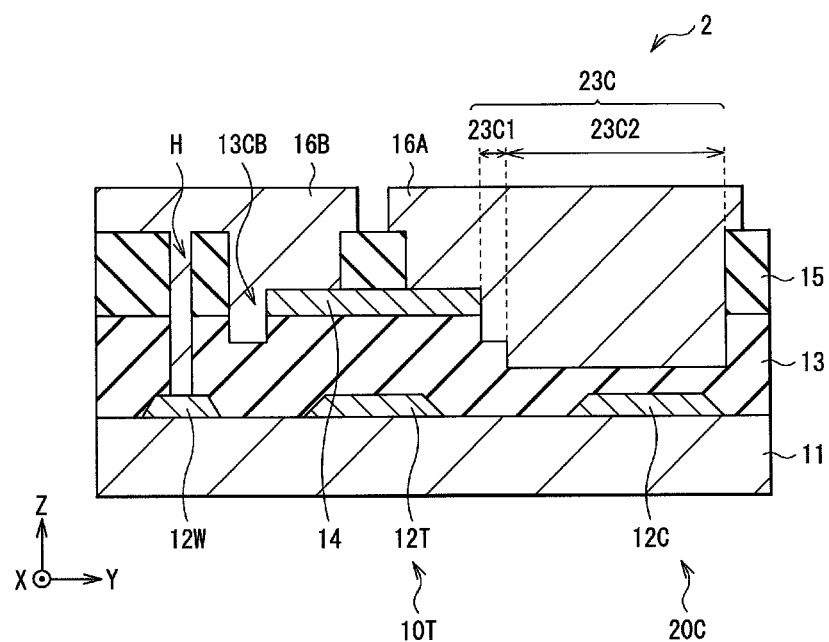

FIG. 13 is a cross-sectional view illustrating a configuration of a main portion of a display unit according to a second embodiment of the present application.

Figure 14A:
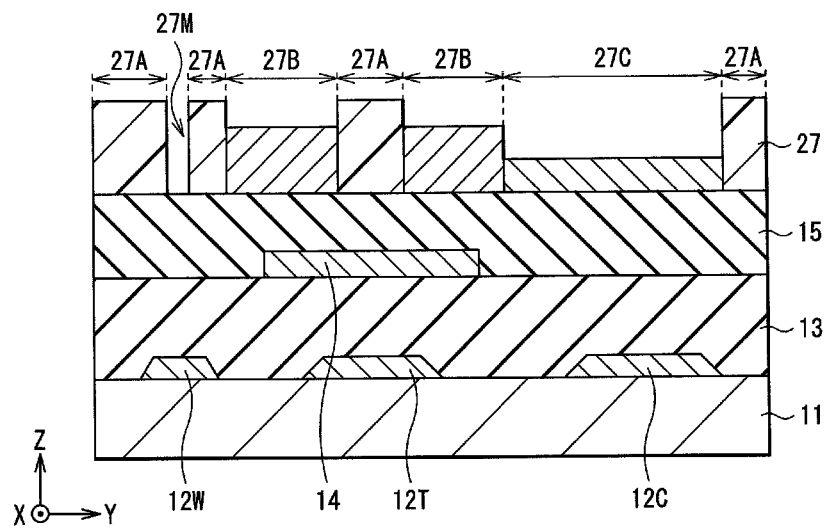

FIG. 14A is a cross-sectional view illustrating a step of manufacturing the display unit illustrated in FIG. 13.

Figure 14B:
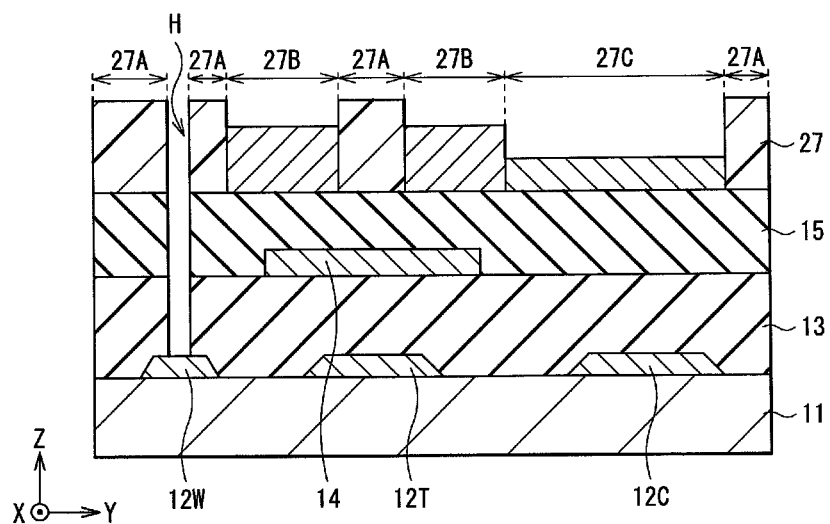

FIG. 14B is a cross-sectional view illustrating a step following the step of FIG. 14A.

Figure 14C:
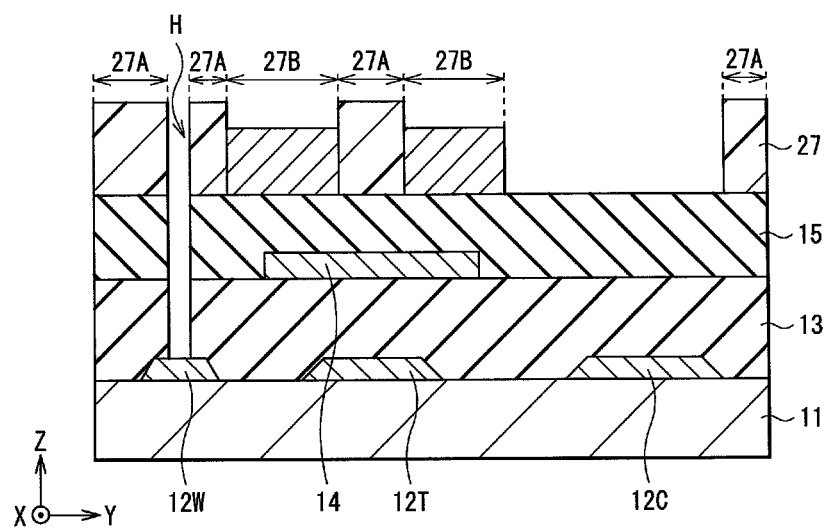

FIG. 14C is a cross-sectional view illustrating a step following the step of FIG. 14B.

Figure 15A:
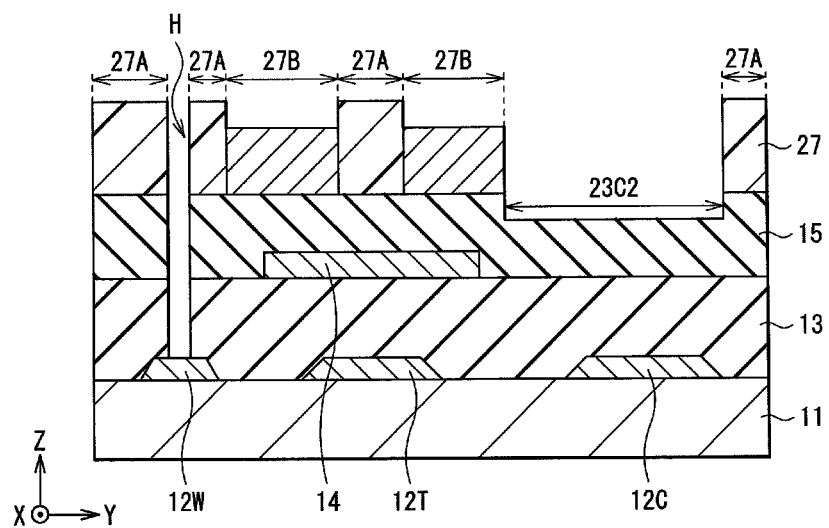

FIG. 15A is a cross-sectional view illustrating a step following the step of FIG. 14C.

Figure 15B:
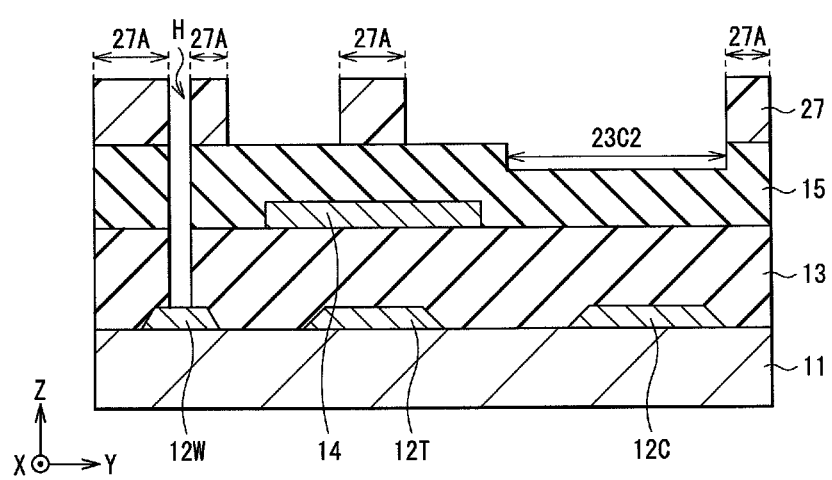

FIG. 15B is a cross-sectional view illustrating a step following the step of FIG. 15A.

Figure 15C:
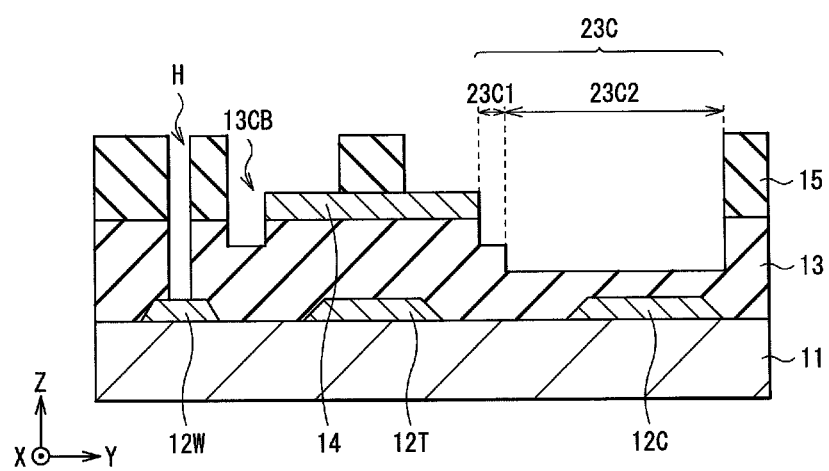

FIG. 15C is a cross-sectional view illustrating a step following the step of FIG. 15B.

Figure 16:
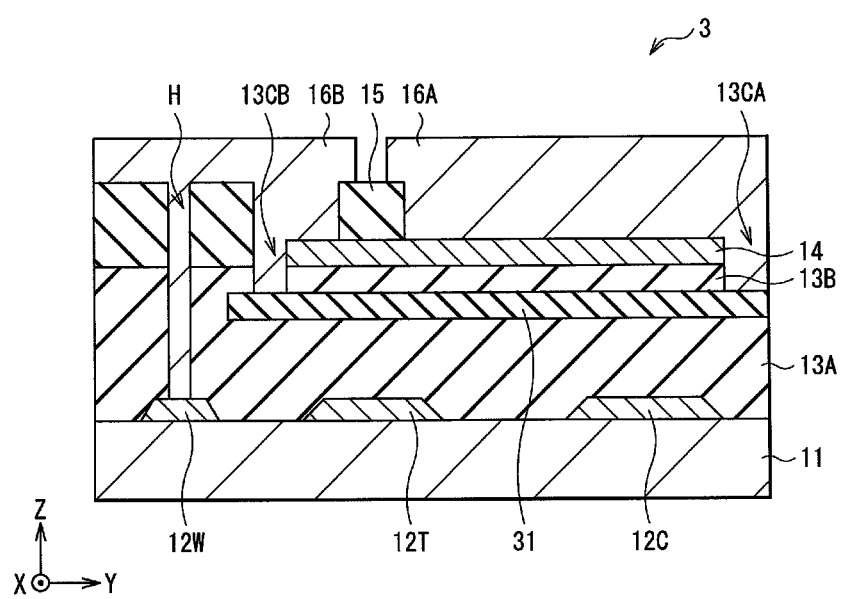

FIG. 16 is a cross-sectional view illustrating a configuration of a main portion of a display unit according to a third embodiment of the present application.

Figure 17A:
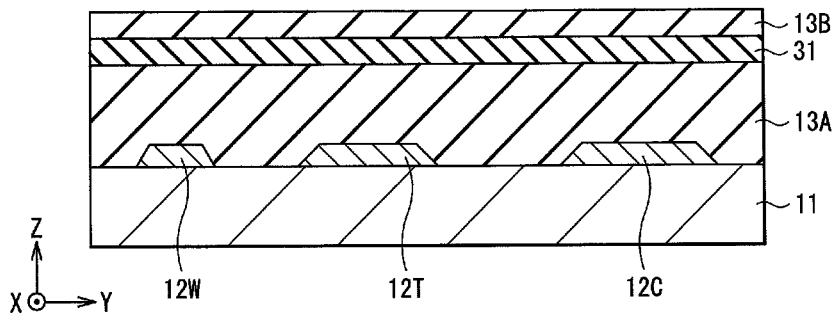

FIG. 17A is a cross-sectional view illustrating a step of manufacturing the display unit illustrated in FIG. 16.

Figure 17B:
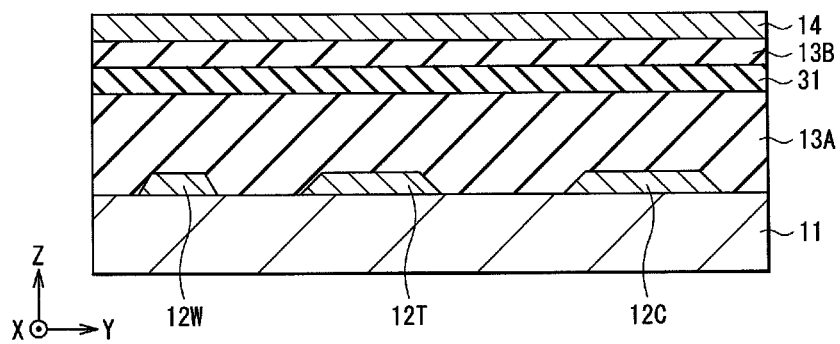

FIG. 17B is a cross-sectional view illustrating a step following the step of FIG. 17A.

Figure 17C:
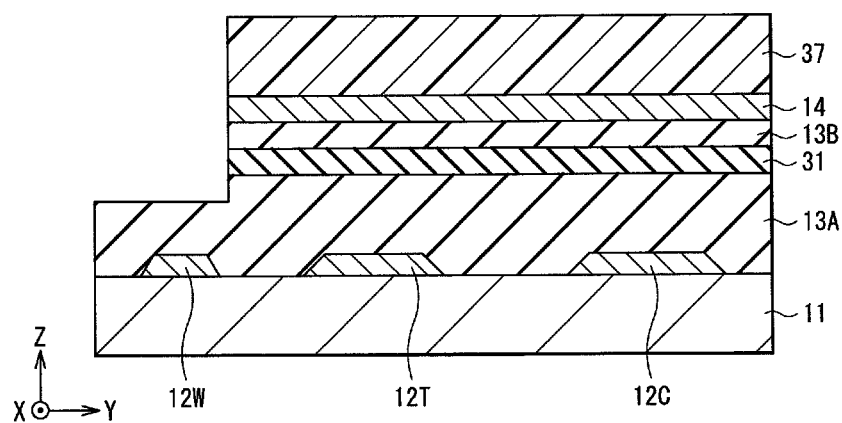

FIG. 17C is a cross-sectional view illustrating a step following the step of FIG. 17B.

Figure 18A:
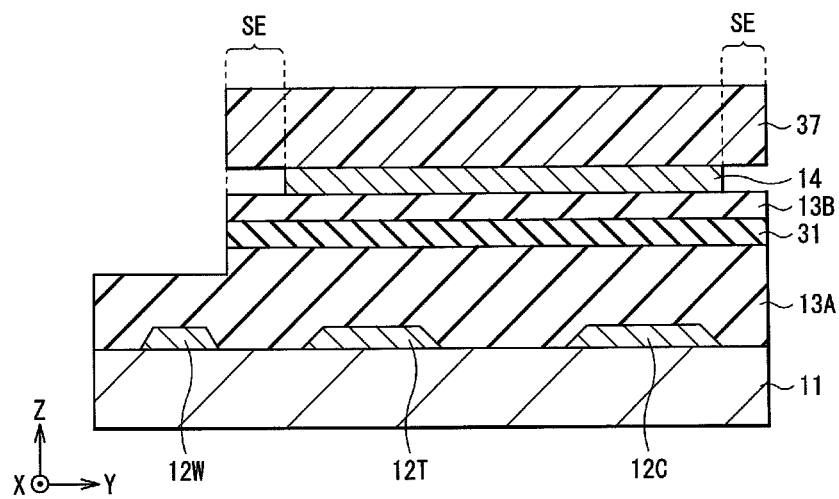

FIG. 18A is a cross-sectional view illustrating a step following the step of FIG. 17C.

Figure 18B:
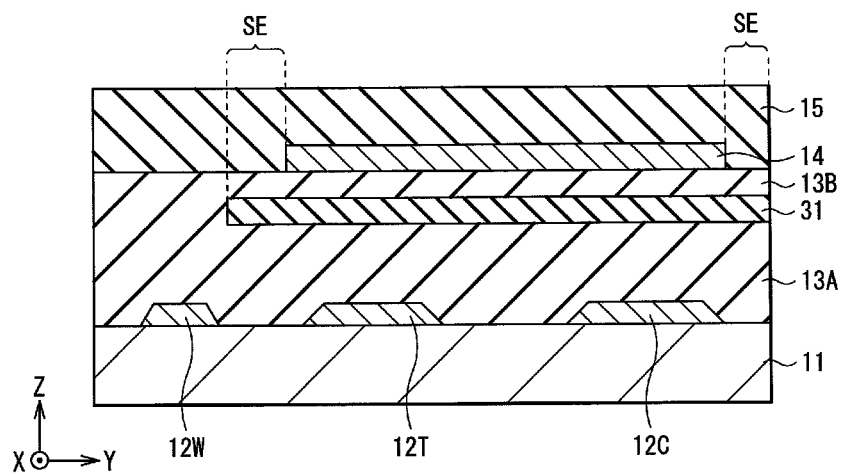

FIG. 18B is a cross-sectional view illustrating a step following the step of FIG. 18A.

Figure 18C:
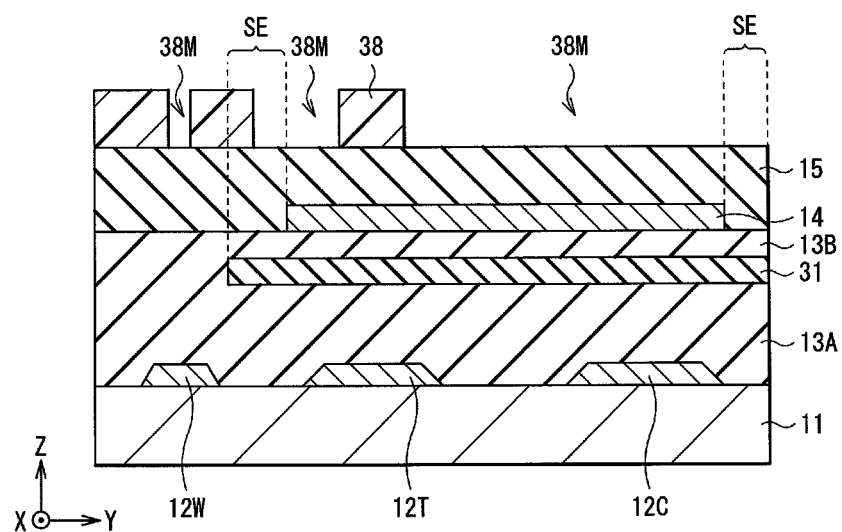

FIG. 18C is a cross-sectional view illustrating a step following the step of FIG. 18B.

Figure 19A:
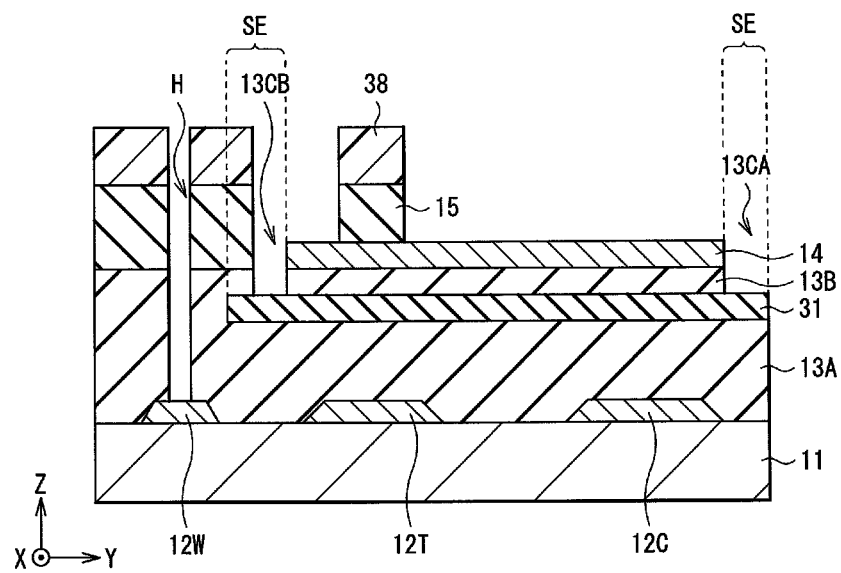

FIG. 19A is a cross-sectional view illustrating a step following the step of FIG. 18C.

Figure 19B:
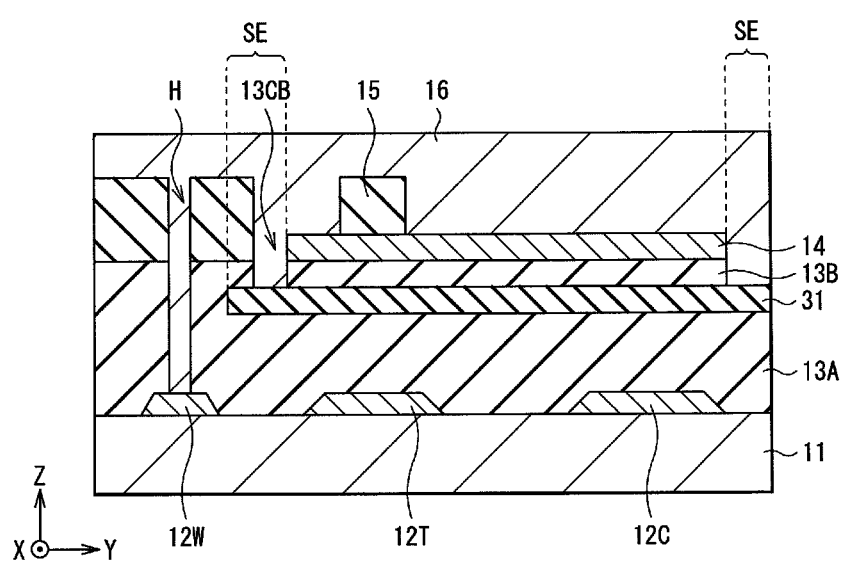

FIG. 19B is a cross-sectional view illustrating a step following the step of FIG. 19A.

Figure 20A:
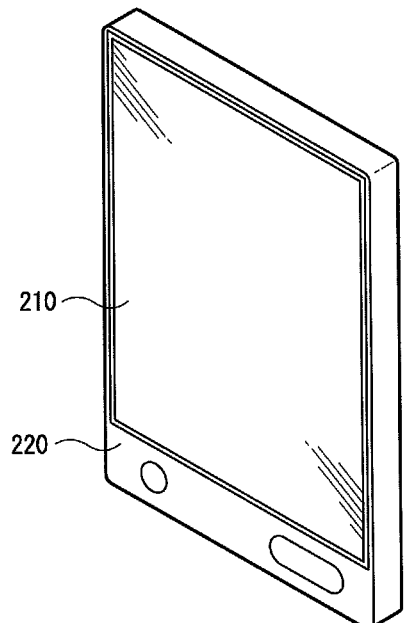

FIG. 20A is a perspective view illustrating an appearance of Application example 1 of any of the display units according to the foregoing embodiments and the like.

Figure 20B:
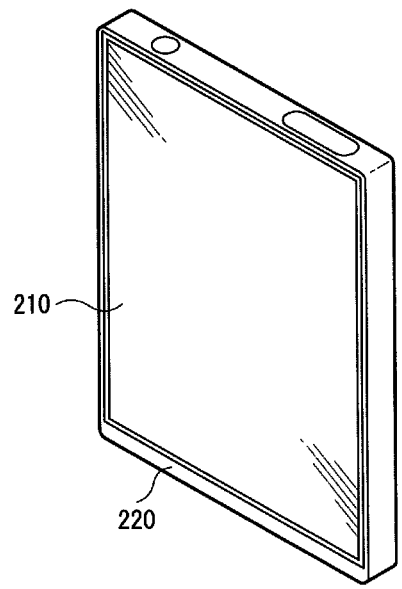

FIG. 20B is a perspective view illustrating another example of the appearance of Application example 1 illustrated in FIG. 20A.

Figure 21:
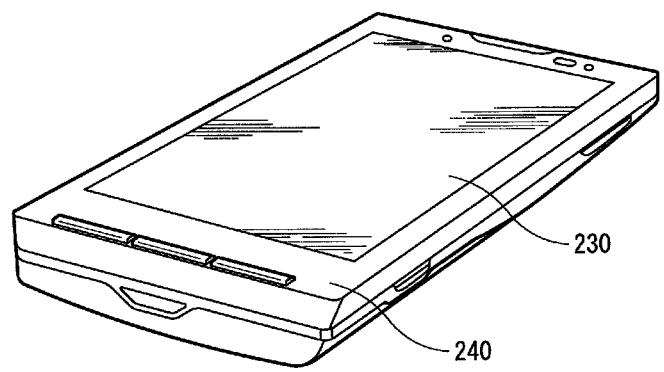

FIG. 21 is a perspective view illustrating an appearance of Application example 2.

Figure 22:
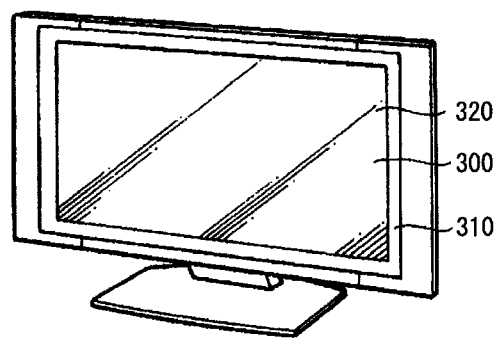

FIG. 22 is a perspective view illustrating an appearance of Application example 3.

Figure 23A:
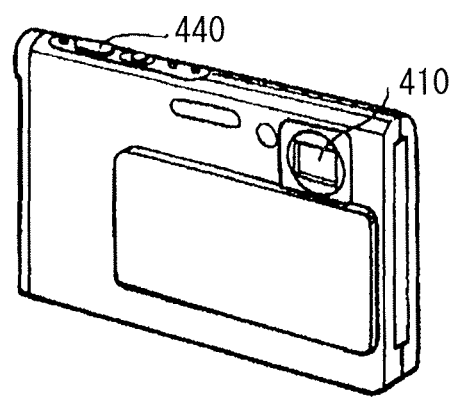

FIG. 23A is a perspective view illustrating an appearance viewed from the front side of Application example 4.

Figure 23B:
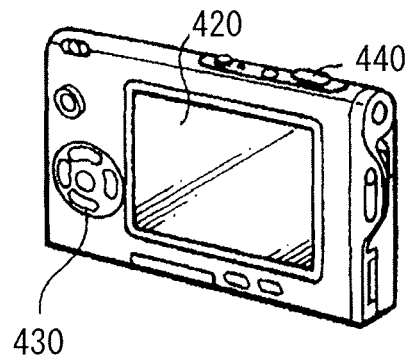

FIG. 23B is a perspective view illustrating an appearance viewed from the rear side of Application example 4.

Figure 24:
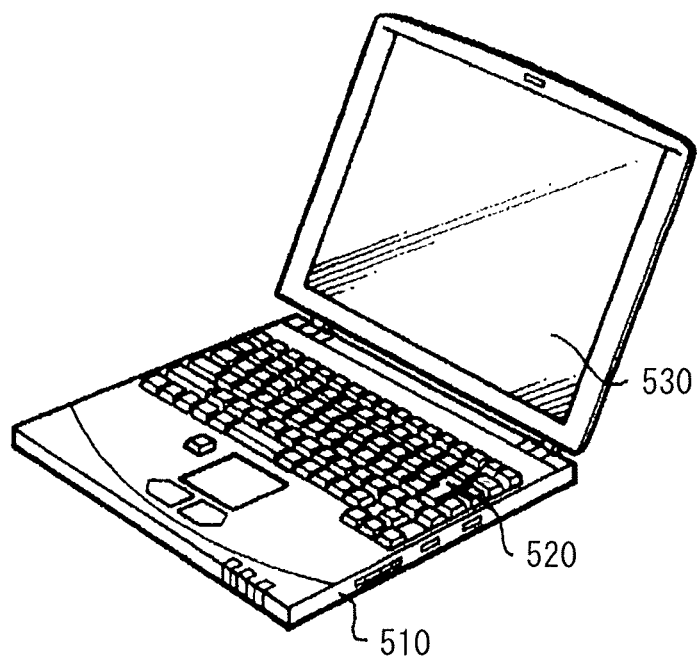

FIG. 24 is a perspective view illustrating an appearance of Application example 5.

Figure 25:
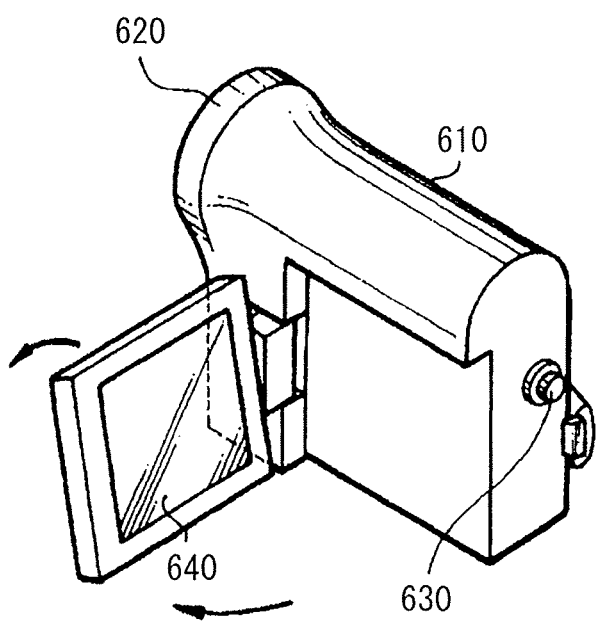

FIG. 25 is a perspective view illustrating an appearance of Application example 6.

Figure 26A:
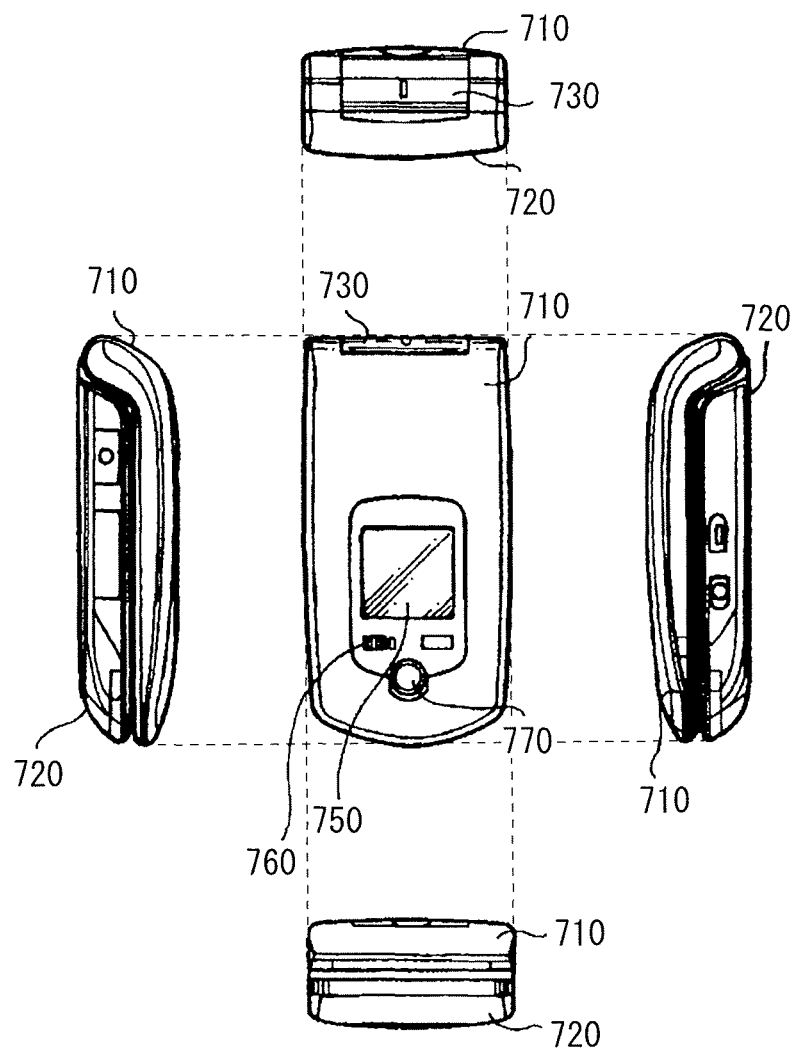

FIG. 26A is a view illustrating a closed state of Application example 7.

Figure 26B:
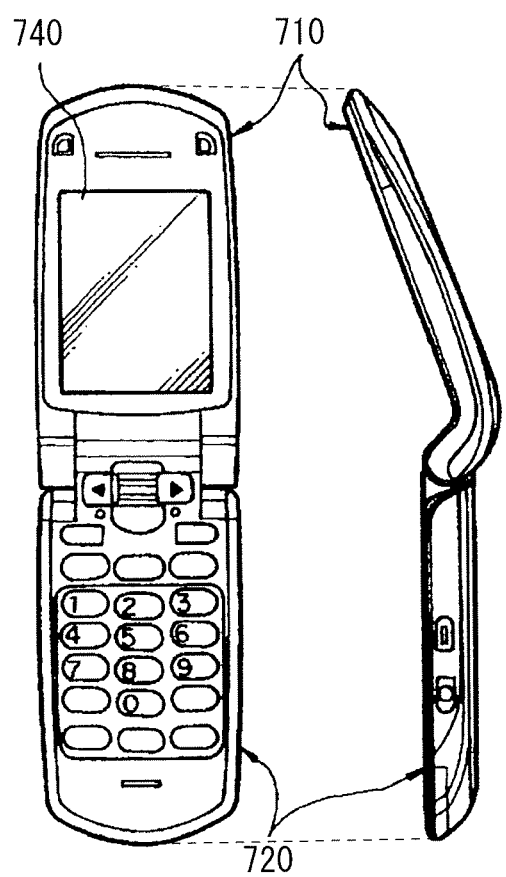

FIG. 26B is a view illustrating an open state of Application example 7.

DETAILED DESCRIPTION

Figure 1:
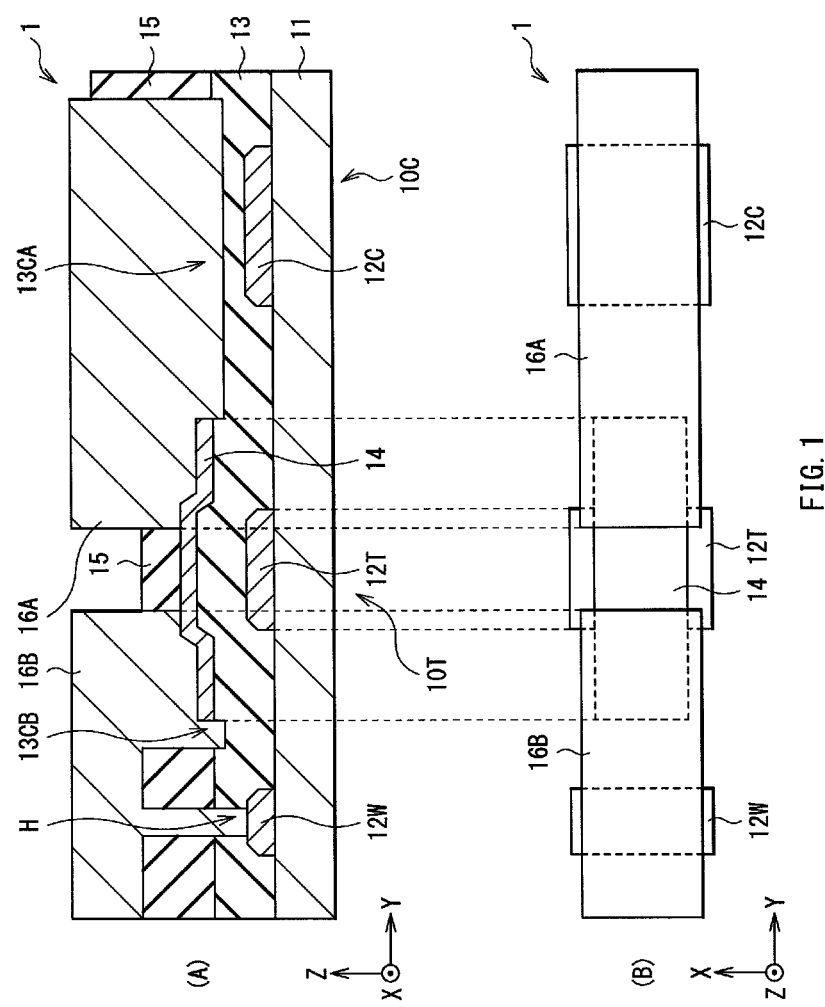

Some embodiments of the present application will be described in detail below with reference to the drawings. The description will be given in the following order.
1. First Embodiment (a display unit: an example in which a display unit is manufactured with the use of a halftone mask)
2. Second Embodiment (a display unit: an example in which a display unit is manufactured with the use a multi-gradation mask having a plurality of semi-transmissive regions)
3. Third Embodiment (a display unit: an example in which a display unit is manufactured with the use of a hard mask)
4. Application Examples 1. First Embodiment Part (A) and Part (B) of FIG. 1 illustrate a configuration of a main portion of a display unit 1 according to a first embodiment of the present application. Part (A) of FIG. 1 illustrates a cross-sectional configuration, and Part (B) of FIG. 1 illustrates a planar configuration. The display unit 1 has a transistor 10T and a retentive capacitor 10C for driving a plurality of pixels (pixels 100R, 100G, and 100B in after-described FIG. 2) on a substrate 11.

The transistor 10T is a bottom-gate-type TFT having a gate electrode 12T, a first insulating film 13, and a semiconductor film 14 in this order from the substrate 11 side. On the central portion of the semiconductor film 14, a second insulating film 15 is provided as a channel protective film. The semiconductor film 14 is also in contact with electrically-conductive films 16A and 16B, which are electrically connected to the semiconductor film 14. The transistor 10T is electrically connected to a wiring 12W through the electrically-conductive film 16B (a first electrically-conductive film). The retentive capacitor 10C has a lower electrode 12C (an electrode), the first insulating film 13, and the electrically-conductive film 16A as an upper electrode from the substrate 11 side. The first insulating film 13 and the electrically-conductive film 16A (a second electrically-conductive film) are shared with the transistor 10T.

Figure 2:
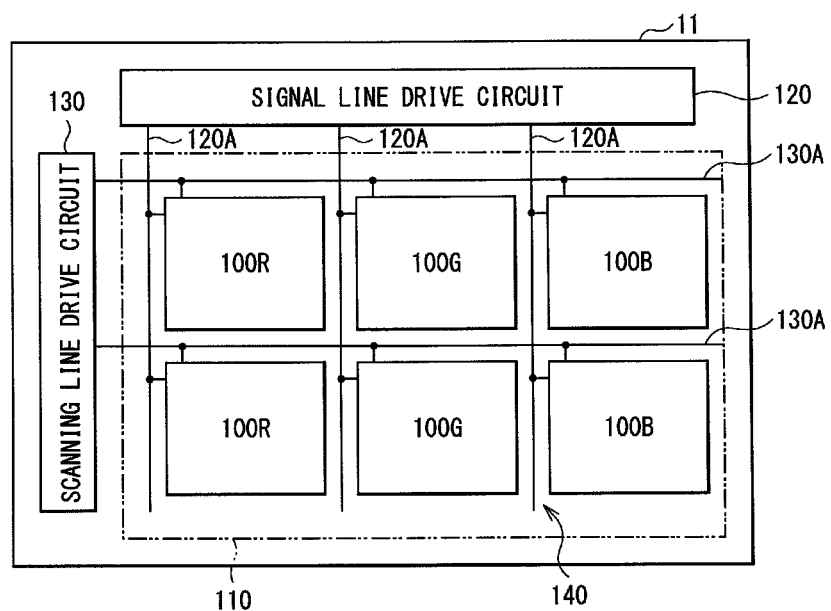
FIG. 2 is a diagram illustrating a whole configuration of the display unit illustrated in Part (A) and Part (B) of FIG. 1.

As illustrated in FIG. 2, in the display unit 1, the plurality of pixels 100R, 100G, and 100B are arranged in a state of matrix in a display region 110 on the substrate 11. The pixels 100R, 100G, and 100B are configured to emit red light, green light, and blue light respectively. For driving the pixels 100R, 100G, and 100B, a signal line drive circuit 120 and a scanning line drive circuit 130 for displaying an image are provided around the display region 110, and a pixel drive circuit 140 is provided in the display region 110.

Figure 3:
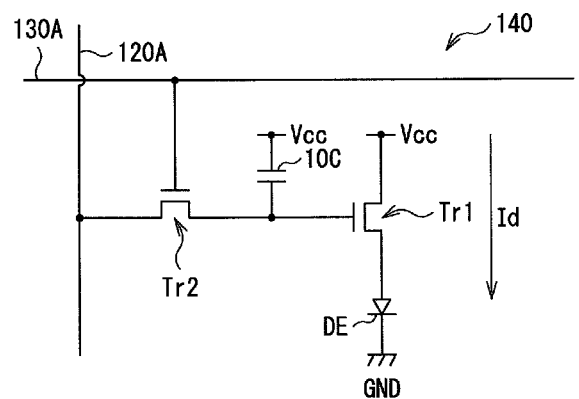
FIG. 3 is a diagram illustrating an example of a pixel drive circuit illustrated in FIG. 2.

FIG. 3 illustrates an example of the pixel drive circuit 140. The pixel drive circuit 140 is an active-type drive circuit, and has a drive transistor Tr1, a writing transistor Tr2, and the retentive capacitor 10C between the transistors Tr1 and Tr2. The foregoing transistor 10T may serve, for example, as the writing transistor Tr2. A display element DE such as an organic EL (Electroluminescence) element is connected in series with the drive transistor Tr1 between a first electric power source line (Vcc) and a second electric power source line (GND).

In the pixel drive circuit 140, a plurality of signal lines 120A are arranged in a column direction, and a plurality of scanning lines 130A are arranged in a row direction. Every intersection of each signal line 120A and each scanning line 130A corresponds to one of the pixels 100R, 100G, and 100B. Each signal line 120A is connected to the signal line drive circuit 120, and an image signal is supplied from the signal line drive circuit 120 to a source electrode of the writing transistor Tr2 through the signal line 120A. The foregoing wiring 12W serves, for example, as the signal line 120A. Each scanning line 130A is connected to the scanning line drive circuit 130, and scanning signals are sequentially supplied from the scanning line drive circuit 130 to a gate electrode of the writing transistor Tr2 through the scanning line 130A.

The substrate 11 may be made of a glass substrate, a plastic film, or the like. Examples of a plastic material may include PET (polyethylene terephthalate) and PEN (polyethylene naphthalate). If the semiconductor film 14 is allowed to be formed without heating the substrate 11 by a sputtering method or the like, an inexpensive plastic film may be used for the substrate 11.

The gate electrode 12T (Part (A) and Part (B) of FIG. 1) has a role to apply a gate voltage to the transistor 10T and to control carrier density in the semiconductor film 14 by the gate voltage. The gate electrode 12T is provided in a selective region on the substrate 11, and may be made, for example, of a simple substance of metal such as platinum (Pt), titanium (Ti), ruthenium (Ru), molybdenum (Mo), copper (Cu), tungsten (W), nickel (Ni), aluminum (Al), and tantalum (Ta) or an alloy thereof. The gate electrode 12T may be made, for example, of a light-transmissive oxide having, for example, indium (In) or zinc (Zn) as a main component. Specifically, the gate electrode 12T may be made of a transparent electrically-conducive thin film such as indium tin oxide (ITO), indium zinc oxide (IZO), and zinc oxide (ZnO). The gate electrode 12T may have a laminated structure in which two or more thereof are layered. For example, in such a laminated structure, an aluminum layer or an aluminum alloy layer having a thickness (a thickness in a lamination direction (Z direction), and hereinafter simply referred to as "thickness") of 400 nm and a molybdenum layer having a thickness of 50 nm are layered from the substrate 11 side. Examples of the aluminum alloy layer may include an aluminum-neodymium alloy layer. For example, the wiring 12W and the lower electrode 12C of the retentive capacitor 10C may be provided in the same layer as that of the gate electrode 12T. For the wiring 12W and the lower electrode 12C, a material similar to any of the foregoing material of the gate electrode 12T may be used. The materials and the thicknesses of the wiring 12W and the lower electrode 12C may be the same as those of the gate electrode 12T, and may be different from those thereof.

The first insulating film 13 is provided on the whole surface of the substrate 11, exists between the gate electrode 12T and the semiconductor film 14 in the transistor 10T, and exists between the lower electrode 12C and the electrically-conductive film 16A in the retentive capacitor 10C. The first insulating film 13 has a connection hole H in a portion opposed to the wiring 12W. The wiring 12W and the electrically-conductive film 16B (the transistor 10T) are electrically connected through the connection hole H. In this embodiment, the first insulating film 13 further has concave sections 13CA and 13CB shallower than the connection hole H in positions adjacent to the semiconductor film 14. Thereby, the electrically-conductive films 16A and 16B are buried in the concave sections 13CA and 13CB, and end portions of the semiconductor film 14 are allowed to be covered with the electrically-conductive films 16A and 16B. That is, moisture intrusion into the semiconductor film 14 is prevented, and thereby, reliability of the transistor 10T is allowed to be improved. The electrically-conductive film 16A is buried in the concave section 13CA (a second concave section), and the electrically-conductive film 16B is buried in the concave section 13CB (a first concave section).

Figure 4:
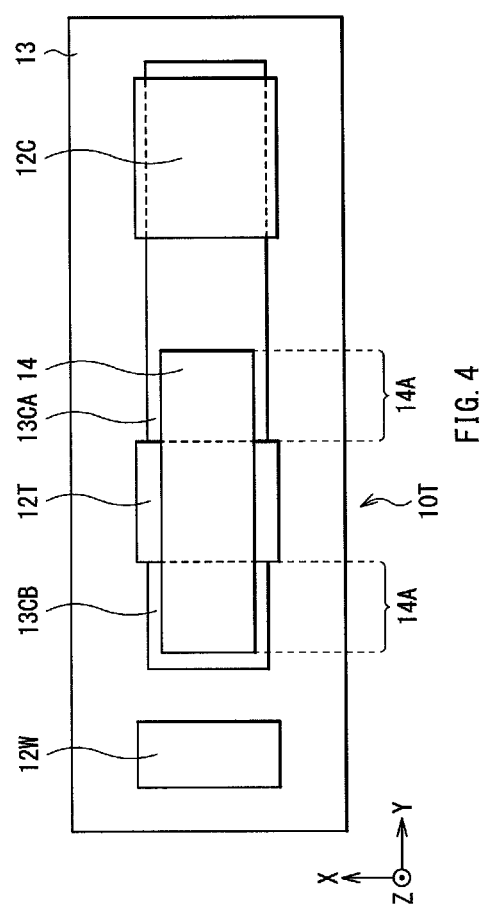
FIG. 4 is a plan view illustrating a configuration of a concave section illustrated in Part (A) of FIG. 1.

As illustrated in FIG. 4, the concave section 13CA and the concave section 13CB are opposed to each other with the gate electrode 12T in between in a channel length direction (Y direction in FIG. 4) of the transistor 10T. The concave sections 13CA and 13CB are provided to surround the semiconductor film 14. More specifically, the concave sections 13CA and 13CB are provided around an unopposed region 14A of the semiconductor film 14. The unopposed region 14A is unopposed to the gate electrode 12T. The concave section 13CA into which the electrically-conductive film 16A is buried extends toward the retentive capacitor 10C, and, for example, the lower electrode 12C of the retentive capacitor 10C may be opposed to the concave section 13CA. That is, the thickness of the first insulating film 13 between the lower electrode 12C and the electrically-conductive film 16A is smaller than that of the first insulating film 13 between the gate electrode 12T and the semiconductor film 14. Thereby, compared to a case in which the first insulating film having a constant thickness is provided, the retentive capacity per unit area of the retentive capacitor 10C is improved. Therefore, the formation area of the retentive capacitor 10C is allowed to be decreased. The first insulating film 13 between the lower electrode 12C and the electrically-conductive film 16A may be thinner by, for example, from about 50 nm to about 200 nm both inclusive than the first insulating film 13 between the gate electrode 12T and the semiconductor film 14.

Figure 5:
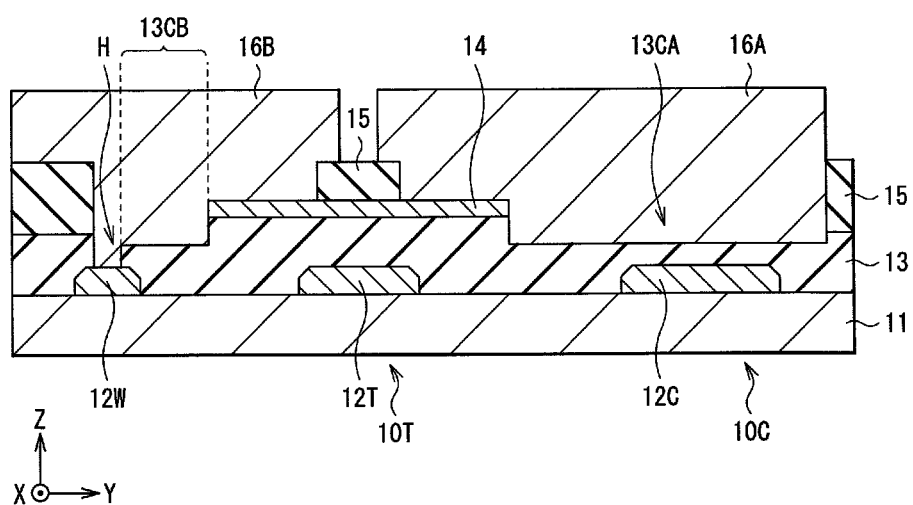
FIG. 5 is a cross-sectional view illustrating another example of an arrangement of the concave section and a connection hole that are illustrated in Part (A) of FIG. 1.

As described later, since the connection hole H and the concave sections 13CA and 13CB are formed in the same photolithography step, each of sidewalls of the connection hole H forms the same plane from the first insulating film 13 to the second insulating film 15 (Part (A) of FIG. 1). For example, as illustrated in FIG. 5, the concave section 13CB may be adjacent to the connection hole H. At this time, part of a sidewall (a sidewall on the side opposite to the concave section 13CB) of the connection hole H forms the same plane from the first insulating film 13 to the second insulating film 15.

The first insulating film 13 may be formed, for example, of an insulating film including one or more of a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. The first insulating film 13 may have a single-layer structure, or a laminated structure made of two or more materials such as SiN and SiO. In the case where the first insulating film 13 has the laminated structure made of two or more materials, for example, interface characteristics with respect to the semiconductor film 14 are allowed to be improved, and mixing of impurity from ambient air into the semiconductor film 14 is allowed to be effectively suppressed. The first insulating film 13 may have a thickness, for example, from 200 nm to 500 nm both inclusive.

The semiconductor film 14 is provided on the first insulating film 13 in the shape of an island, and has a channel region in a position opposed to the gate electrode 12T between the pair of electrically-conductive films 16A and 16B. The semiconductor film 14 may be made of an oxide semiconductor containing an oxide of one or more elements of indium (In), gallium (Ga), zinc (Zn), silicon (Sn), tin (Sn), aluminum (Al), and titanium (Ti) as a main component, for example. The semiconductor film 14 may be formed of an oxide of a mixture of these elements. Examples of the oxide semiconductor may include indium tin zinc oxide (ITZO) and indium gallium zinc oxide (IGZO: InGaZnO) as amorphous oxides. Part of the semiconductor film 14 may be made of such an amorphous oxide semiconductor. A crystalline oxide semiconductor such as zinc oxide (ZnO), indium zinc oxide (IZO), indium gallium oxide (IGO), ITO, and indium oxide (InO) may be used for the semiconductor film 14. As a transparent oxide semiconductor containing zinc as a main component, for example, indium gallium zinc oxide (IGZO), zinc oxide, aluminum-doped zinc oxide (AZO), gallium-doped zinc oxide, or the like may be applied to the semiconductor film 14. The semiconductor film 14 may be in an amorphous state or in a crystal state. However, in the case where the semiconductor film 14 is in a crystal state, resistant characteristics to an etching solution is improved, which facilitates application to formation of a device structure. The semiconductor film 14 may be made of an organic semiconductor material. For example, the organic semiconductor material may contain an organic electrically-conductive material and a doping material. As the organic electrically-conductive material, for example, one or more of polythiophene, polypyrrole, polyaniline, polyacetylene, polyphenylene, polyfuran, polyselenophene, polyisothianaphthene, polyphenylene sulfide, polyphenylene vinylene, polythienylene vinylene, polynaphthalene, polyanthracene, polypyrene, polyazulene, phthalocyanine, pentacene, merocyanine, and polyethylene dioxythiophene may be used. As the doping material, for example, one or more of iodine, perchloric acid, hydrochloric acid, sulfuric acid, nitric acid, phosphoric acid, boric acid tetrafluoride, arsenic pentafluoride, hexafluorophosphate, alkyl sulfonic acid, perfluoro alkyl sulfonic acid, polyacrylic acid, polystyrene sulfonate, and dodecylbenzenesulfonic acid may be used. The semiconductor film 14 may be made of polysilicon or amorphous silicon. The thickness of the semiconductor film 14 may be preferably, for example, from 5 nm to 100 nm both inclusive in consideration of oxygen supply efficiency by annealing in a manufacturing step.

Part in a thickness direction from the surface (the top surface) other than a channel region of the semiconductor film 14 may be a low resistance region (not illustrated) having an electric resistivity lower than that of the channel region. The low resistance region may be formed, for example, by diffusing a metal such as aluminum into an oxide semiconductor. The transistor 10T may be a transistor configured of a self-aligning structure having such a low resistance region. Thereby, characteristics of the transistor 10T are stabilized. The semiconductor film 14 may extend to the region of the retentive capacitor 10C, and may be shared between the transistor 10T and the retentive capacitor 10C (not illustrated). At this time, the foregoing low resistance region includes a region to be one electrode of the retentive capacitor 10C.

For example, on the central portion of the semiconductor film 14, the second insulating film 15 may be provided as a channel protective film. The second insulating film 15 is configured to prevent damage of the semiconductor film 14 (the channel region) at the time of forming the electrically-conductive films 16A and 16B. The second insulating film 15 may be provided on a region other than the semiconductor film 14. For example, the second insulating film 15 may be laminated on a portion of the first insulating film 13 around the connection hole H and on circumferences (on the side opposite to the semiconductor film 14) of the concave sections 13CA and 13CB. The second insulating film 15 may be made, for example, of one of a silicon oxide film, an aluminum oxide film, and a silicon nitride film, and the thickness thereof may be, for example, about 300 nm.

The pair of electrically-conductive films 16A and 16B is paired with each other with the second insulating film 15 in between in the channel length direction of the semiconductor film 14, and is in contact with the semiconductor film 14. That is, the pair of electrically-conductive films 16A and 16B is a source-drain electrode of the transistor 10T. The electrically-conductive films 16A and 16B extend to external sides of the semiconductor film 14. The electrically-conductive films 16A and 16B in the concave sections 13CA and 13CB are in contact with and cover the end portions of the semiconductor film 14. The electrically-conductive film 16A buried in the concave section 13CA is opposed to the lower electrode 12C with the first insulating film 13 in between, and configures the retentive capacitor 10C. The electrically-conductive film 16B buried in the concave section 13CB is in contact with the wiring 12W through the connection hole H. For the electrically-conductive films 16A and 16B, a material similar to that of the gate electrode 12T may be used. For example, each of the electrically-conductive films 16A and 16B may be formed of a laminated film in which a titanium layer having a thickness of 50 nm, an aluminum layer having a thickness from 200 nm to 1 µm both inclusive, and a titanium layer having a thickness of 50 nm are layered from the semiconductor film 14 side. A component material of the electrically-conductive films 16A and 16B may be selected as appropriate according to a purpose and an application of the transistor 10T. For example, each of the electrically-conductive films 16A and 16B may be formed of a laminated film configured of a molybdenum layer, an aluminum layer, and a molybdenum layer, or a laminated film configured of a molybdenum layer, an aluminum layer, and a titanium layer.

Such a display unit 1 may be manufactured, for example, as follows (FIG. 6A to FIG. 8B).

First, a metal film is formed on the whole surface of the substrate 11, for example, by a sputtering method or a vacuum evaporation method, and subsequently, the metal film is patterned, for example, by photolithography and etching, and thereby, the gate electrode 12T, the lower electrode 12C, and the wiring 12W are formed. The gate electrode 12T, the lower electrode 12C, and the wiring 12W may be formed in different steps.

Next, a silicon oxide film is formed on the whole surface of the substrate 11 on which the gate electrode 12T, the lower electrode 12C, and the wiring 12W are provided, for example, by a plasma-enhanced chemical vapor-phase deposition (PECVD) method to form the first insulating film 13. For forming the first insulating film 13, a sputtering method may be used.

Figure 6A:
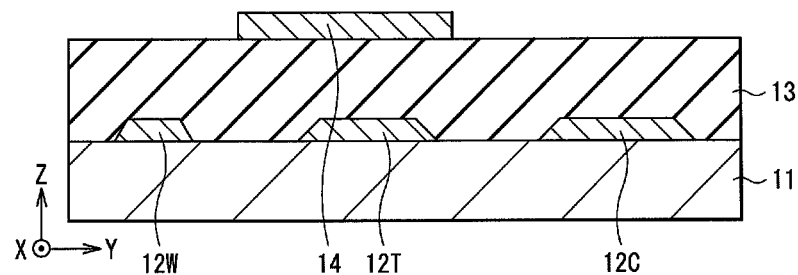
FIG. 6A is a cross-sectional view illustrating a step of manufacturing the display unit illustrated in Part (A) and Part (B) of FIG. 1.

After the first insulating film 13 is formed, the semiconductor film 14 made, for example, of an oxide semiconductor is formed on the first insulating film 13 (FIG. 6A). The semiconductor film 14 is formed by forming an oxide semiconductor material on the first insulating film 13, for example, by a DC (Direct Current) sputtering method, and subsequently pattering the resultant by photolithography and etching. Although the oxide semiconductor material may be formed by an RF (Radio Frequency) sputtering method or the like as well, the DC sputtering method may be preferably used in view of a deposition rate.

Figure 6B:
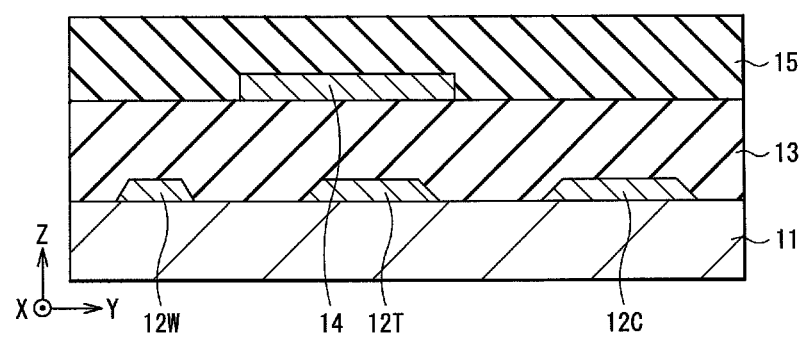
FIG. 6B is a cross-sectional view illustrating a step following the step of FIG. 6A.

Subsequently, as illustrated in FIG. 6B, a silicon oxide film having a thickness, for example, of 300 nm is formed on the whole surface of the substrate 11 on which the semiconductor film 14 is provided to form the second insulating film 15. Next, photolithography is performed with the use of a multi-gradation mask such as a halftone mask (an exposure mask having a halftone pattern) to form the connection hole H and the concave sections 13CA and 13CB. While a general mask is configured of two regions, one of which has light transmissibility of 0% (a light shielding section) and the other of which has light transmissibility of 100% (an opening section), the halftone mask is provided with a semi-transmissive region (for example, a region having light transmissibility of from 10% to 70% both inclusive) in addition to the foregoing two regions. Formation of the connection hole H and the concave sections 13CA and 13CB with the use of the halftone mask may be made, for example, as follows.

Figure 6C:
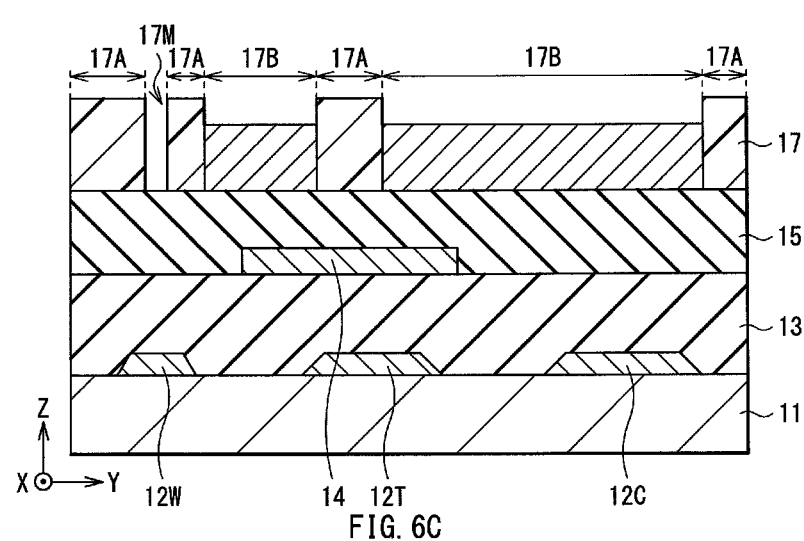
FIG. 6C is a cross-sectional view illustrating a step following the step of FIG. 6B.

First, after a resist 17 is provided on the second insulating film 15, exposure and development are performed with the use of the halftone mask to from a pattern of the resist 17 (FIG. 6C). Directly above the wiring 12W (in a region where the connection hole H is to be formed), an opening section of the halftone mask is arranged when the resist 17 is a positive resist, while a light-shielding section of the halftone mask is arranged when the resist 17 is a negative resist. By controlling an exposure amount as above, an opening section 17M in which the resist 17 is completely removed, a remaining section 17A of the resister 17, and a thin film section 17B of the resist 17 are formed on the second insulating film 15. The thin film section 17B is a section where the thickness of the resist 17 is smaller than that of the remaining section 17A, that is, a section where the half-transmissive region of the halftone mask is arranged. The opening section 17M is formed in the region where the connection hole H is to be formed, the remaining section 17A is formed in a region where the second insulating film 15 as a channel protective film is to be formed, and the thin film section 17B is formed in a region covering the end portions of the semiconductor film 14 (the end portions of the unopposed region 14A). The remaining section 17A is formed in portions other than regions where the connection hole H and the concave sections 13CA and 13CB are to be formed outside of the semiconductor film 14 (the portion around the connection hole H and the outer circumferences of the concave sections 13CA and 13CB).

Figure 7A:
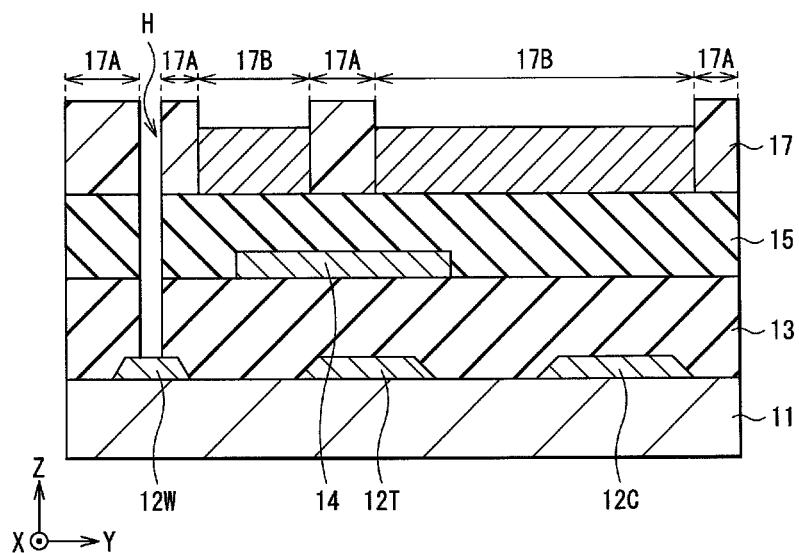
FIG. 7A is a cross-sectional view illustrating a step following the step of FIG. 6C.
Figure 7B:
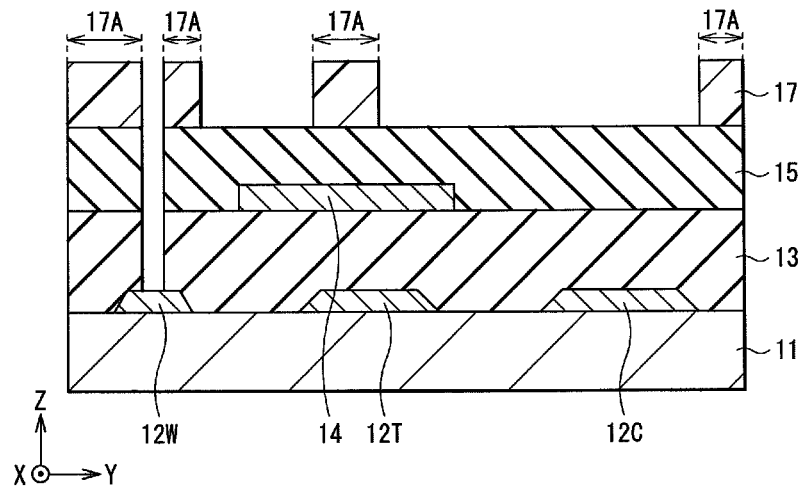
FIG. 7B is a cross-sectional view illustrating a step following the step of FIG. 7A.
Figure 8A:
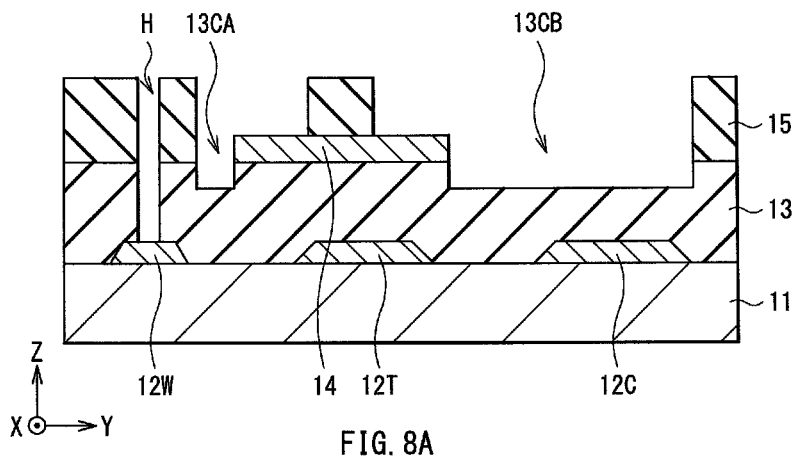
FIG. 8A is a cross-sectional view illustrating a step following the step of FIG. 7B.

After the pattern of the resist 17 having the opening section 17M, the remaining section 17A, and the thin film section 17B is formed, the second insulating film 15 and the first insulating film 13 are etched with the use of the pattern of the resist 17 as a mask. Specifically, first, as illustrated in FIG. 7A, portions of the second insulating film 15 and the first insulating film 13 that are opposed to the opening section of the resist 17 are removed by etching to form the connection hole H. Next, after the resist 17 in the thin film section 17B is removed by ashing (FIG. 7B), etching is performed to form the concave sections 13CA and 13CB (FIG. 8A). At this time, while conditions that the semiconductor film 14 is not etched are selected, the concave sections 13CA and 13CB are formed in the positions adjacent to the semiconductor film 14. In the portions where the remaining section 17A is provided, the first insulating film 13 and the second insulating film 15 remain. By such etching, the resist 17 in the remaining section 17A may be removed. Ashing may be performed separately.

Figure 8B:
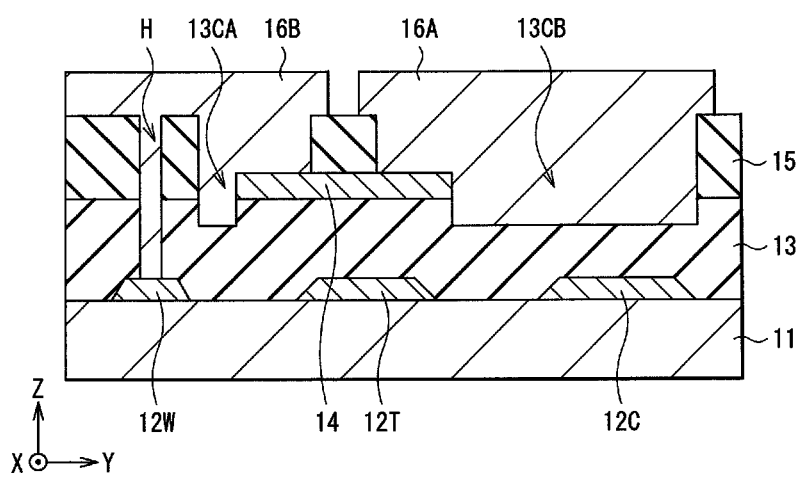
FIG. 8B is a cross-sectional view illustrating a step following the step of FIG. 8A.

After the connection hole H and the concave sections 13CA and 13CB are formed, as illustrated in FIG. 8B, the electrically-conductive films 16A and 16B are formed. The electrically-conductive films 16A and 16B are formed by forming a molybdenum layer having a thickness of 50 nm, an aluminum layer having a thickness of 500 nm, and a molybdenum layer having a thickness of 50 nm in this order, for example, by a sputtering method, and subsequently, patterning the resultant into a desired shape by photolithography and etching. After the thin film transistor 10T, the retentive capacitor 10C, and the wiring 12W (the pixel drive circuit 140) are formed as described above, the display element DE is further formed, and thereby, the display unit 1 is completed.

In the display unit 1 according to this embodiment, the connection hole H and the concave sections 13CA and 13CB are formed by one exposure step with the use of a halftone mask as a multi-gradation mask as described above. Therefore, the high-reliable transistor 10T is allowed to be manufactured by a simpler method. For details, description will be given below.

Part (A) of FIG. 9 illustrates a cross-sectional configuration of a display unit 101 according to Comparative example 1, and Part (B) of FIG. 9 illustrates a planar configuration of the display unit 101. In the display unit 101, as illustrated in FIG. 10A and FIG. 10B, the second insulating film 15 serving as a channel protective film on the semiconductor film 14 and the connection hole H are allowed to be formed by one photolithography step. Specifically, after the second insulating film 15 is formed on the substrate 11, a resist 170 is provided on the second insulating film 15, and exposure and development are performed to from a pattern of the resist 170 (FIG. 10A). A mask used at this time is a general mask, that is, a mask in which a semi-transmissive region is not provided. Therefore, the pattern of the resist 170 is configured of only a remaining section 170A and an opening section 170M. The opening section 170M is formed in a region where the connection hole H is to be formed, in a region where the semiconductor film 14 and the electrically-conductive films 16A and 16B are to be connected, and in a region where the retentive capacitor 10C is to be formed. The remaining section 170A is formed in a region where the second insulating film 15 as a channel protective film is to be formed, and in a region where end portions of the semiconductor film 14 are covered. After the pattern of the resist 170 is formed, etching is performed to form the connection hole H and the second insulating film 15 (a channel protective film) on the semiconductor film 14 (FIG. 10B).

Although the display unit 101 is allowed to be manufactured easily, reliability thereof may be lowered due to moisture intrusion into the semiconductor film 14. One reason for this is that, in the display unit 101, a concave section shallower than the connection hole H does not exist in a position adjacent to the semiconductor film 14, and the second insulating film 15 is in contact with the end portions of the semiconductor film 14. While the electrically-conductive films 16A and 16B having high density are formed, density of the second insulating film 15 is low, and therefore, moisture may pass through the second insulating film 15 to intrude into the semiconductor film 14. Further, since the semiconductor film 14 made, for example, of an oxide semiconductor material or an organic semiconductor material may be easily degraded by heat, in the step forming the second insulating film 15 after providing the semiconductor film 14, film formation temperature is not allowed to be increased, and the density thereof is further decreased. Further, the second insulating film 15 itself easily contains moisture. In the semiconductor film 14 mixed with moisture, reliability thereof is lowered, for example, hump characteristics are easily shown in sub-threshold characteristics after a reliability test.

It is to be noted that in the foregoing manufacturing method (FIG. 10A and FIG. 10B), a structure in which the end portions of the semiconductor film 14 are covered with the electrically-conductive films 16A and 16B is not allowed to be formed. In order to cover the end portions of the semiconductor film 14 with the electrically-conductive films 16A and 16B, the opening section 170M of the resist 170 is arranged in regions where the end portions of the semiconductor film 14 are covered. However, in the case where the opening section 170M is etched, the second insulating film 15 and a first insulating film 130 are wholly removed, and therefore, a through hole reaching the substrate 11 is formed in a position adjacent to the semiconductor film 14. In this case, part of the electrically-conductive films 16A and 16B and part of the gate electrode 12T overlap each other, and therefore, short-circuit fault occurs between the electrically-conductive films 16A and 16B and the gate electrode 12T due to the through hole.

Further, since a concave section does not exist in the position adjacent to the semiconductor film 14 of the display unit 101, the thickness of the first insulating film 130 between the gate electrode 12T and the semiconductor film 14 is the same as the thickness of the first insulating film 130 between the lower electrode 12C and the semiconductor film 14. Therefore, in the display unit 101, the capacity of a retentive capacitor 110C is not allowed to be increased.

Further, in the etching step (FIG. 10B) of the first insulating film 130 and the second insulating film 15, the region where the semiconductor film 14 and the electrically-conductive films 16A and 16B are to be contacted (the opening section 170M of the resist 170 on the semiconductor film 14) and the region where the connection hole H is to be formed (the opening section 170M of the resist 170 outside of the semiconductor film 14) are concurrently etched. Therefore, an excessive load is applied on the region where only the second insulating film 15 on the semiconductor film 14 is etched (the region where the semiconductor film 14 and the electrically-conductive films 16A and 16B are to be contacted), and the semiconductor film 14 may be degraded.

A display unit 102 according to Comparative example 2 illustrated in Part (A) and Part (B) of FIG. 11 has concave sections 130CA and 130CB in positions adjacent to the semiconductor film 14, and the electrically-conductive films 16A and 16B buried in the concave sections 130CA and 130CB cover the end portions of the semiconductor film 14. Part (A) of FIG. 11 illustrates a cross-sectional configuration of the display unit 102, and Part (B) of FIG. 11 illustrates a planar configuration of the display unit 102.

However, upon manufacturing the display unit 102, the concave sections 130CA and 130CB and the connection hole H should be formed by different photolithography steps (FIGS. 12A to 12D), and the number of steps is increased.

Specifically, first, after the second insulating film 15 is formed on the substrate 11, a resist 271 is provided on the second insulating film 15, and exposure and development are performed to from a pattern of the resist 271 (FIG. 12A). A mask used at this time is a general mask, that is, a mask in which a semi-transmissive region is not provided. Therefore, the pattern of the resist 271 is configured only of a remaining section 271A and an opening section 271M. The opening section 271M is formed in a region where the end portions of the semiconductor film 14 are covered, and the remaining section 271A is formed in a region where the second insulating film 15 as a channel protective film is to be formed. The remaining section 271A is formed in portions (the outer circumferences of the concave sections 130CA and 130CB) other than regions where the concave sections 130CA and 130CB are to be formed outside of the semiconductor film 14. After the pattern of the resist 271 is formed, etching is performed with the use of the pattern of the resist 271 as a mask to form the concave sections 130CA and 130CB (FIG. 12B). Next, after ashing is performed on the resist 271, a resist 272 is newly provided on the substrate 11, and exposure and development are performed to form a pattern of the resist 272 (FIG. 12C). A mask used at this time is a general mask, that is, a mask in which a semi-transmissive region is not provided.

Therefore, the pattern of the resist 272 is configured only of a remaining section 272A and an opening section 272M. The opening section 271M is formed in a region where the connection hole H is to be formed, and the remaining section 272A is formed in the other regions. Etching is performed with the use of the pattern of the resist 272 as a mask to form the connection hole H (FIG. 12D).

As described above, in this example, the concave sections 130CA and 130CB are formed by the pattern of the resist 271, and the connection hole H is formed by the pattern of the resist 272. Therefore, the number of steps is increased, and misalignment easily occurs. For example, it may be difficult to form the concave section 130CB and the connection hole H separately from each other, and the connection hole H is formed inside the concave section 130CB. At this time, the position of a side wall of the concave section 130CB is not aligned with the position of a side wall of the connection hole H in consideration of a margin, and therefore, a step is formed in the side wall of the connection hole H. Further, although the capacity per unit area of a retentive capacitor 120C is increased by the concave section 130CA, the formation area of the concave section 130CA is less likely to be decreased since the concave section 130CA is formed in view of a margin.

In contrast, in the display unit 1 according to this embodiment, the concave sections 13CA and 13CB and the connection hole H may be formed by one photolithography step (one mask) with the use of, for example, a halftone mask. Therefore, moisture intrusion into the semiconductor film 14 is prevented, and manufacturing is achievable by a simpler method. Further, since the concave section 13CA is provided, the thickness of the first insulating film 13 between the lower electrode 12C and the electrically-conductive film 16A is smaller than the thickness of the first insulating film 13 between the gate electrode 12T and the semiconductor film 14. Therefore, the capacity per unit area of the retentive capacitor 10C is improved.

Further, since the concave sections 13CA and 13CB and the connection hole H are formed by one mask, it is not necessary to consider misalignment, and the formation area of the retentive capacitor 10C is allowed to be decreased. The concave section 13CB and the connection hole H may be provided separately from each other, and part or all of each of the side walls of the connection hole H forms the same plane from the first insulating film 13 to the second insulating film 15.

Further, since the connection hole H (FIG. 7A) and the concave sections 13CA, 13CB (FIG. 8A) are etched in different steps, each etching time is allowed to be individually adjusted. Therefore, by forming the connection hole H that penetrates through the second insulating film 15 and the first insulating film 13 in first, degradation of the semiconductor film 14 due to excessive etching is allowed to be prevented.

In the display unit 1, a scanning signal is supplied from the scanning line 130A to each of the display elements DE through the gate electrode of the transistor Tr2, and an image signal from the signal line 120A (the wiring layer 12W) is retained in the retentive capacitor 10C through the source-drain electrode of the transistor Tr2. That is, the transistor Tr2 is on-off controlled according to the signal retained in the retentive capacitor 10C, and thereby, a drive current is injected into the display element DE. In the transistors Tr1 and Tr2, when a voltage (a gate voltage) equal to or larger than a threshold value voltage is applied to the gate electrode, a current (a drain current) is generated in the channel region in the semiconductor layer between the source electrode and the drain electrode, and the foregoing drive is performed.

In this example, the concave sections 13CA and 13CB are provided in the positions adjacent to the end portions of the semiconductor film 14, and the electrically-conductive films 16A and 16B are buried in the concave sections 13CA and 13CB. Therefore, moisture intrusion into the semiconductor film 14 is suppressed, and for example, hump characteristics may be improved. The concave sections 13CA and 13CB are formed in one photolithography step together with the connection hole H for connecting the wiring 12W to the electrically-conductive film 16B. Therefore, the highly-reliable transistor 10T is allowed to be manufactured by a simpler method. Further, by the concave section 13CA, the thickness of the first insulating film 13 between the lower electrode 12C and the electrically-conductive film 16A is decreased, and the capacity of the retentive capacitor 10C is allowed to be improved.

In the display unit 1 according to this embodiment, since the connection hole H and the concave sections 13CA and 13CB are provided by one photolithography step, the highly-reliable transistor 10T is allowed to be manufactured by a simpler method.

Description will be given below of other embodiments. In the following description, for the same components as those of the foregoing embodiment, the same referential symbols are affixed thereto, and description thereof will be omitted as appropriate.

Second Embodiment

FIG. 13 illustrates a cross-sectional configuration of a main portion of a display unit 2 according to a second embodiment of the present application. In one concave section (a concave section 23C) of the display unit 2, a plurality of regions (regions 23C1 and 23C2) having different depths are provided. Except for this point, the display unit 2 has a configuration similar to that of the display unit 1, and the function and the effect thereof are similar to those of the display unit 1.

The concave section 23C may be provided, for example, in a position adjacent to the semiconductor film 14 on a retentive capacitor (a retentive capacitor 20C) side, and has the shallower region 23C1 and the deeper region 23C2 in this order from the semiconductor film 14 side. The region 23C2 is opposed to the lower electrode 12C of the retentive capacitor 20C. For example, the depth of the shallower region 23C1 may be the same as the depth of a concave section 13CB paired with the concave section 23C, and the depth of the deeper region 23C2 may be larger than that of the concave section 13CB, for example, by about 50 nm to about 200 nm both inclusive. By providing the deeper region 23C2 in the concave section 23C as described above, the capacity of the retentive capacitor 20C is allowed to be further improved.

In the retentive capacitor, as the depth of the concave section is larger, the thickness of the first insulating film becomes smaller, and thereby, the capacity per unit area is allowed to be increased. However, in this case, in the case where the concave section has a constant depth, the thickness of the first insulating film 13 is suddenly decreased in the positions adjacent to the semiconductor film 14 (in the end portions of the semiconductor film 14), and therefore, TDDB (Time Dependent Dielectric Breakdown) characteristics in the end portions of the semiconductor film 14 may be lowered. Further, a parasitic capacity between the gate electrode 12T and the electrically-conductive film 16A is increased.

Therefore, by providing the shallower region 23C1 in a position closer to the semiconductor film 14 and providing the deeper region 23C2 in the position opposed to the lower electrode 12C, the capacity of the retentive capacitor 20C is allowed to be increased while lowered TDDB characteristics and increase of the parasitic capacity are prevented.

Such a display unit 2 may be manufactured, for example, as follows.

First, after the first step to the step of forming the second insulating film 15 are performed as in the foregoing first embodiment, a resist 27 is provided on the second insulating film 15 to form a pattern of the resist 27 (FIG. 14A). The pattern of the resist 27 is formed by exposure and development with the use of a multi-degradation mask. The multi-degradation mask has two types of semi-transmissive regions each having different light transmissibility (for example, each having light transmissibility of from 10% to 70% both inclusive) in addition to two regions, one of which has light transmissibility of 0% (a light shielding section) and the other of which has light transmissibility of 100% (opening section). When the resist 27 is a positive resist, the region having higher light transmissibility out of the semi-transmissive regions of the multi-degradation mask is arranged in a region opposed to the lower electrode 12C, while the region having lower light transmissibility out of the semi-transmissive regions of the multi-degradation mask is arranged in a region opposed to a portion adjacent to the semiconductor film 14. In contrast, when the resist 27 is a negative resist, the region having lower light transmissibility out of the semi-transmissive regions of the multi-degradation mask is arranged in the region opposed to the lower electrode 12C, while the region having higher light transmissibility out of the semi-transmissive regions of the multi-degradation mask is arranged in the region opposed to the portion adjacent to the semiconductor film 14.

By controlling an exposure amount as described above, an opening section 27M in which the resist 27 is completely removed, a remaining section 27A of the resister 27, and thin film sections 27B and 27C of the resist 17 are formed on the second insulating film 15. The thin film sections 27B and 27C are sections each having a thickness of the resist 27 smaller than that of the remaining section 27A. Further, the thickness of the thin film section 27C is even smaller than that of the thin film section 27B. The thin film sections 27B and 27C are sections configured of the semi-transmissive regions of the multi-gradation mask. The opening section 27M is formed in a region where the connection hole H is to be formed, the remaining section 27A is formed in a region where the second insulating film 15 as a channel protective film is to be formed, and the thin film section 27B is formed in a region where end portions of the semiconductor film 14 (end portions of the region 14A not opposed to the gate electrode 12T) are covered, and the thin film section 27C is formed in a region opposed to the lower electrode 12C. The remaining section 27A is formed in portions other than regions where the connection hole H and the concave sections 13CA and 13CB are to be formed outside of the semiconductor film 14 (a portion around the connection hole H and outer circumferences of the concave sections 23CA and 13CB).

After the pattern of the resist 27 having the opening section 27M, the remaining section 27A, and the thin film sections 27B and 27C is formed, the second insulating film 15 and the first insulating film 13 are etched with the use of the pattern of the resist 27 as a mask. Specifically, first, as illustrated in FIG. 14B, portions of the second insulating film 15 and the first insulating film 13 that are opposed to the opening section 27M of the resist 27 are removed by etching to form the connection hole H. Next, after the resist 27 in the thin film section 27C is removed by ashing (FIG. 14C), and etching is performed to form the region 23C2 of the concave section 23C (FIG. 15A). Thereafter, the resist in the thin film section 27B is removed by ashing (FIG. 15B) to perform etching (FIG. 15C). At this time, while conditions that the semiconductor film 14 is not etched are selected, the concave sections 13CB and the region 23C1 of the concave section 23C are formed in the positions adjacent to the semiconductor film 14. In the portions where the remaining section 27A is provided, the first insulating film 13 and the second insulating film 15 remain. By such etching, the resist 27 in the remaining section 27A may be removed. Ashing may be performed separately.

Third Embodiment

FIG. 16 illustrates a cross-sectional configuration of a main portion of a display unit 3 according to a third embodiment of the present application. The display unit 3 has a third insulating film 31 together with gate insulating films 13A and 13B between the gate electrode 12T and the semiconductor film 14. The third insulating film 31 is made of a material having a high selected ratio of an etching rate between the gate insulating films 13A and 13B, and serves as a hard mask as described later. Except for this point, the display unit 3 has a configuration similar to that of the display unit 1, and the function and the effect thereof are similar to those of the display unit 1.

For example, each of the gate insulating films 13A and 13B may be made of a silicon oxide film, and the third insulating film 31 may be made of a silicon nitride film. The gate insulating film 13A, the third insulating film 31, and the gate insulating film 13B are provided in this order from the gate electrode 12T side. The concave sections 13CA and 13CB penetrate through the gate insulating film 13B, and reaches the third insulating film 31. That is, bottom surfaces of the concave sections 13CA and 13CB are configured of the third insulating film 31. Only one of the gate insulating films 13A and 13B may be provided to form a single-layered gate insulating film. The concave section 13CA is not necessarily provided in a position opposed to the lower electrode 12C (FIG. 16).

Such a display unit 3 may be manufactured, for example, as follows. First, as illustrated in FIG. 17A, after the gate electrode 12T, the lower electrode 12C, and the wiring 12W are provided on the substrate 11, the gate insulating film 13A, the third insulating film 31, and the gate insulating film 13B are formed in this order on the whole surface of the substrate 11. The total thickness of the gate insulating films 13A and 13B and the third insulating film 31 may be, for example, from 200 nm to 500 nm both inclusive.

Next, after an oxide semiconductor material is formed on the gate insulating film 13B, the resultant film is patterned by a resist 37 to form the semiconductor film 14 (FIG. 17B and FIG. 17C). At this time, the gate insulating film 13B and the third insulating film 31 are also patterned to have the same planer shape as that of the semiconductor film 14. Subsequently, with the use of the resist 37 as a mask, selective side etching of the semiconductor film 14 is performed (FIG. 18A). Thereby, end portions of the semiconductor film 14 are removed, and part of the gate insulating film 13B is exposed. That is, regions (SE regions) where the third insulating film 31 is extended from the end portions of the semiconductor film 14 are generated, and the third insulating film 31 is allowed to be used as a hard mask in a subsequent step. For the side etching of the semiconductor film 14, a wet etchant having different etching selectivity between the semiconductor film 14; and the gate insulating films 13A, 13B and the third insulating film 31 (specifically, a wet etchant with which etching rate of the gate insulating films 13A and 13B is slower than that of the semiconductor film 14) may be used. For example, as a wet etchant, an acid solution such as oxalic acid may be used.

After performing the side etching of the semiconductor film 14, as illustrated in FIG. 18B, the second insulating film 15 may be formed, for example, on the whole surface of the substrate 11. Next, the second insulating film 15 is patterned by a photolithography step. Specifically, first, as illustrated in FIG. 18C, a resist 38 is formed on the second insulating film 15. In the resist 38, an opening 38M is provided in a region where the connection hole H is to be formed, and the opening 38M is also provided in a region including a region where the concave sections 13CA and 13CB are to be formed and a region opposed to the lower electrode 12C. Next, for example, by dry etching, the second insulating film 15 and the gate insulating films 13A and 13B may be patterned to form the connection hole H and the concave sections 13CA and 13CB (FIG. 19A). The dry etching is performed under conditions in which etching selectivity is different between the gate insulating films 13A, 13B and the third insulating film 31 (specifically, conditions in which etching rate of the third insulating film 31 is smaller than that of the gate insulating films 13A and 13B). Therefore, the third insulating film 31 serves as a hard mask, and the concave sections 13CA and 13CB shallower than the connection hole H is allowed to be formed in part of the SE regions. For example, in the case where each of the gate insulating films 13A and 13B is made of a silicon oxide film, and the third insulating film 31 is made of a silicon nitride film, dry etching by mixed gas such as [$C_4F_8$/CO] and [$C_4F_8$/$O_2$] may be used. After the second insulating film 15 is patterned, as illustrated in FIG. 19B, an electrically-conductive film 16 is formed and patterned to form the electrically-conductive films 16A and 16B. As described above, the concave sections 13CA and 13CB and the connection hole H may be formed with the use of the third insulating film 31 as a hard mask instead of the multi-gradation mask by patterning the hard mask in one step.

APPLICATION EXAMPLES

Description will be given of application examples in which any of the foregoing display units (the display units 1 and 2) is applied to an electronic apparatus. Examples of the electronic apparatus may include a television, a digital camera, a notebook personal computer, a portable terminal device such as a mobile phone, and a video camcorder. In other words, any of the foregoing display units is applicable to an electronic apparatus in any field for displaying an image signal inputted from outside or an image signal generated inside as an image or a video.

Application Example 1

FIG. 20A and FIG. 20B respectively illustrate appearances of an electronic book to which any of the display units according to the foregoing embodiments is applied. The electronic book may have, for example, a display section 210 and a non-display section 220, and the display section 210 is configured of any of the display units according to the foregoing embodiments.

Application Example 2

FIG. 21 illustrates an appearance of a smartphone to which any of the display units according to the foregoing embodiments is applied. The smartphone may have, for example, a display section 230 and a non-display section 240. The display section 230 is configured of any of the display units according to the foregoing embodiments.

Application Example 3

FIG. 22 illustrates an appearance of a television to which any of the display units according to the foregoing embodiments is applied. The television may have, for example, an image display screen section 300 including a front panel 310 and a filter glass 320. The image display screen section 300 is configured of any of the display units according to the foregoing embodiments.

Application Example 4

FIG. 23A and FIG. 23B illustrate appearances of a digital camera to which any of the display units according to the foregoing embodiments is applied. The digital camera may have, for example, a light emitting section 410 for a flash, a display section 420, a menu switch 430, and a shutter button 440. The display section 420 is configured of any of the display units according to the foregoing embodiments.

Application Example 5

FIG. 24 illustrates an appearance of a notebook personal computer to which any of the display units according to the foregoing embodiments is applied. The notebook personal computer may have, for example, a main body 510, a keyboard 520 for operation of inputting characters and the like, and a display section 530 for displaying an image. The display section 530 is configured of any of the display units according to the foregoing embodiments.

Application Example 6

FIG. 25 illustrates an appearance of a video camcorder to which any of the display units according to the foregoing embodiments is applied. The video camcorder may have, for example, a main body 610, a lens 620 for shooting a subject provided on the front side surface of the main body 610, a start-stop switch 630 for shooting, and a display section 640. The display section 640 is configured of any of the display units according to the foregoing embodiments.

Application Example 7

FIG. 26A and FIG. 26B illustrate appearances of a mobile phone to which any of the display units according to the foregoing embodiments is applied. In the mobile phone, for example, an upper package 710 and a lower package 720 may be jointed by a joint section (a hinge section) 730. The mobile phone may have a display 740, a sub-display 750, a picture light 760, and a camera 770. Either one or both of the display 740 and the sub-display 750 are configured of any of the display units according to the foregoing embodiments.

While the present application has been described with reference to the preferred embodiments, the present application is not limited to the foregoing embodiments, and various modifications may be made. For example, in the foregoing embodiments and the like, the description has been given of the case in which the display element DE is the organic EL display element. However, the display element DE may be any of a liquid crystal display element, an electrophoretic display element, and an inorganic EL display element.

Further, for example, in the foregoing embodiments and the like, the description has been specifically given of the configuration of the transistor 10T. However, the transistor 10T may further have other layer. The semiconductor film 14 may be made of silicon. Further, in the foregoing embodiments, the description has been specifically given of the case in which the transistor 10T is a writing transistor Tr2. However, the transistor 10T may be the drive transistor Tr1.

In addition thereto, the material, the thickness, the film-forming method, the film-forming conditions, and the like of each layer are not limited to those described in the foregoing embodiments, and other materials, other thicknesses, other film-forming methods, and other film-forming conditions may be adopted.

It is possible to achieve at least the following configurations from the above-described example embodiments of the disclosure.

(1) A method of manufacturing a semiconductor device, the method including:
  forming a gate electrode and a wiring;
  covering the gate electrode and the wiring with a first insulating film;
  forming a semiconductor film on the gate electrode with the first insulating film in between;
  covering the semiconductor film and the first insulating film with a second insulating film;
  patterning the second insulating film and the first insulating film by one step to form a connection hole and a first concave section, the connection hole reaching the wiring, and the first concave section being located in a position adjacent to the semiconductor film; and
  forming a first electrically-conductive film in a region from the connection hole to the first concave section to electrically connect the first electrically-conductive film to the wiring through the connection hole and to bury the first electrically-conductive film into the first concave section.

(2) The method according to (1), wherein the second insulating film and the first insulating film are patterned by one photolithography step.

(3) The method according to (1) or (2), wherein
  a second concave section paired with the first concave section in a channel length direction of the semiconductor film is formed together with the first concave section, and
  a second electrically-conducive film is buried in the second concave section.

(4) The method according to (3), wherein the first electrically-conductive film and the second electrically-conductive film are electrically connected to the semiconductor film.

(5) The method according to any one of (1) to (4), wherein the first concave section is formed shallower than the connection hole.

(6) The method according to any one of (1) to (5), wherein the second insulating film and the first insulating film are patterned with the use of a multi-gradation mask.

(7) The method according to (6), wherein a halftone mask is used as the multi-gradation mask.

(8) The method according to (3), wherein
  an electrode is provided together with the gate electrode and the wiring, and
  the electrode is opposed to the second electrically-conducive film in the second concave section to form a retentive capacitor.

(9) The method according to (8), wherein a first region and a second region are formed in the second concave section, the first region being closer to the semiconductor film, and the second region being deeper than the first region, and
  the retentive capacitor is formed in the second region.

(10) The method according to any one of (1) to (9), wherein the first concave section is formed around an unopposed region of the semiconductor film, the unopposed region being unopposed to the gate electrode.

(11) The method according to any one of (1) to (10), wherein the connection hole is formed precedential to the first concave section.

(12) A method of manufacturing a display unit, the method including
  forming a display element and a semiconductor device configured to drive the display element, the forming the display element and the semiconductor device including
    forming a gate electrode and a wiring,
    covering the gate electrode and the wiring with a first insulating film,
    forming a semiconductor film on the gate electrode with the first insulating film in between,
    covering the semiconductor film and the first insulating film with a second insulating film,
    patterning the second insulating film and the first insulating film by one step to form a connection hole and a first concave section, the connection hole reaching the wiring, and the first concave section being located in a position adjacent to the semiconductor film, and
    forming a first electrically-conductive film in a region from the connection hole to the first concave section to electrically connect the first electrically-conductive film to the wiring through the connection hole and to bury the first electrically-conductive film into the first concave section.

(13) A method of manufacturing an electronic apparatus, the method including
  forming a display unit having a display element and a semiconductor device configured to drive the display element, the forming the display unit including
    forming a gate electrode and a wiring,
    covering the gate electrode and the wiring with a first insulating film,
    forming a semiconductor film on the gate electrode with the first insulating film in between,
    covering the semiconductor film and the first insulating film with a second insulating film,
    patterning the second insulating film and the first insulating film by one step to form a connection hole and a first concave section, the connection hole reaching the wiring, and the first concave section being located in a position adjacent to the semiconductor film, and
    forming a first electrically-conductive film in a region from the connection hole to the first concave section to electrically connect the first electrically-conductive film to the wiring through the connection hole and to bury the first electrically-conductive film into the first concave section.

(14) A semiconductor device including:
  a gate electrode and a wiring;
  a first insulating film covering the gate electrode and the wiring;
  a semiconductor film opposed to the gate electrode with the first insulating film in between;
  a first concave section located in a position adjacent to the semiconductor film;
  a connection hole, the connection hole being provided in the first insulating film, and the connection hole reaching the wiring, and
  a first electrically-conductive film, the first electrically-conductive film being electrically connected to the wiring through the connection hole, and the first electrically-conductive film being buried in the first concave section.

(15) The semiconductor device according to (14), further including a second insulating film that covers a channel region of the semiconductor film.

(16) The semiconductor device according to (15), wherein the second insulating film is provided outside the semiconductor film as well, and the connection hole penetrates through the second insulating film and the first insulating film.

(17) The semiconductor device according to (16), wherein part or all of each of side walls of the connection hole configures the same plane from the first insulating film to the second insulating film.

(18) The semiconductor device according to any one of (14) to (17), wherein the connection hole is separated from the first concave section.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
    a wiring;
    a transistor including
        a gate electrode;
        a first insulating film covering the gate electrode and the wiring, and
        a semiconductor film opposed to the gate electrode with the first insulating film in between; and
    a first electrically-conductive film,
    wherein a first concave section is located in the first insulating film in a position directly adjacent to a side surface the semiconductor film, and extends below a lower surface of the of the semiconductor film,
    wherein a connection hole is provided in the first insulating film, the connection hole reaching the wiring, and
    wherein the first electrically-conductive film is electrically connected to the wiring through the connection hole, and the first electrically-conductive film being buried in the first concave section to cover the side surface of the semiconductor film.

2. The semiconductor device according to claim 1, further comprising a second insulating film that covers a channel region of the semiconductor film.

3. The semiconductor device according to claim 2, wherein the second insulating film is provided outside the semiconductor film as well, and the connection hole penetrates through the second insulating film and the first insulating film.

4. The semiconductor device according to claim 3, wherein part or all of each of side walls of the connection hole configures the same plane from the first insulating film to the second insulating film.

5. The semiconductor device according to claim 1, wherein the connection hole is separated from the first concave section.

* * * * *